(12) United States Patent
Matsuno

(10) Patent No.: US 9,912,305 B2
(45) Date of Patent: Mar. 6, 2018

(54) SEMICONDUCTOR INTEGRATED CIRCUIT, COMMUNICATION MODULE, AND SMART METER

(71) Applicant: Renesas Electronics Corporation, Koutou-ku, Tokyo (JP)

(72) Inventor: Noriaki Matsuno, Tokyo (JP)

(73) Assignee: Renesas Electronics Corporation, Tokyo ( * ) Notice: Subject to any disclaimer, the term of this patent is extended or adjusted under 35 U.S.C. 154(b) by 0 days.

(21) Appl. No.: 15/043,591

(22) Filed: Feb. 14, 2016

(65) Prior Publication Data

US 2016/0268983 A1 Sep. 15, 2016

(30) Foreign Application Priority Data

Mar. 9, 2015 (JP) ................................. 2015-045513

(51) Int. Cl.
| | |
|---|---|
| *H03F 3/195* | (2006.01) |
| *H03F 1/56* | (2006.01) |
| *H03F 3/213* | (2006.01) |
| *H03F 1/52* | (2006.01) |
| *H03F 3/24* | (2006.01) |
| *H01L 27/02* | (2006.01) |

(52) U.S. Cl.
CPC ............. *H03F 3/195* (2013.01); *H03F 1/52* (2013.01); *H03F 1/565* (2013.01); *H03F 3/245* (2013.01); *H01L 27/0251* (2013.01); *H03F 2200/222* (2013.01); *H03F 2200/294* (2013.01); *H03F 2200/451* (2013.01); *H03F 2200/534* (2013.01); *H03F 2200/541* (2013.01)

(58) Field of Classification Search
USPC .................................. 330/307, 302, 185, 190
See application file for complete search history.

(56) References Cited

U.S. PATENT DOCUMENTS

| | | | |
|---|---|---|---|
| 7,899,409 B2 * | 3/2011 | Huang ................. | H04B 1/0458 330/277 |
| 9,350,412 B1 * | 5/2016 | Rafi .......................... | H03F 3/19 |
| 2013/0035048 A1 | 2/2013 | Chee et al. | |

* cited by examiner

*Primary Examiner* — Hieu Nguyen
(74) *Attorney, Agent, or Firm* — Shapiro, Gabor and Rosenberger, PLLC

(57) ABSTRACT

A semiconductor integrated circuit includes a transformer that includes a first winding and a second winding, a low-noise amplifier circuit that includes an input terminal in which at least one end of the second winding of the transformer is connected to the input terminal; and a switch that is provided between the one end and another end of the second winding of the transformer. The switch is opened and the transformer functions as an input impedance matching circuit for the low-noise amplifier circuit in a period in which a reception signal is supplied to the first winding of the transformer. On the other hand, the switch is closed and the transformer is caused to become an element including a predetermined capacitance in a period in which another circuit connected to the predetermined node operates.

14 Claims, 21 Drawing Sheets

SEMICONDUCTOR INTEGRATED CIRCUIT, COMMUNICATION MODULE, AND SMART METER

CROSS-REFERENCE TO RELATED APPLICATIONS

This application is based upon and claims the benefit of priority from Japanese patent application No. 2015-045513, filed on Mar. 9, 2015, the disclosure of which is incorporated herein in its entirety by reference.

BACKGROUND

The present invention relates to a semiconductor integrated circuit, a communication module, and a smart meter, and to, for example, a semiconductor integrated circuit, a communication module, and a smart meter which include an impedance matching circuit.

In recent years, a radio communication apparatus capable of transmitting and receiving a high-frequency signal has been widely used. US Patent Publication No. 2013/0035048 discloses a technique relating to a transceiver circuit used in such a radio communication apparatus. More specifically, US Patent Publication No. 2013/0035048 discloses a technique relating to a front end system including a transmitter circuit, a receiver circuit, and a switch circuit that switches between a connection of the transmitter circuit and an antenna and a connection of the receiver circuit and the antenna.

SUMMARY

In recent years, a semiconductor integrated circuit used in a radio communication apparatus has been further miniaturized. However, a switch circuit for switching a connection between transmitter and receiver circuits and an antenna has not been miniaturized enough due to reasons such as an issue in regard to a size of a voltage amplitude of a high-frequency signal handled by the switch circuit, resistance to Electro Static Discharge (ESD) and the like. As a result, the present inventor has found a problem that the miniaturization of the semiconductor integrated circuit used in the radio communication apparatus is insufficient.

Other problems of the related art and new features of the present invention will become apparent from the following descriptions of the specification and attached drawings.

According to an aspect of the invention, a switch is provided at both ends of a second winding of a transformer including a first winding and the second winding. In a period in which a reception signal is supplied to the first winding of the transformer, the switch is opened, and the transformer is made to function as an input impedance matching circuit. On the other hand, in a period in which the transmission signal is not supplied, the switch is closed.

According to the above aspect, a semiconductor integrated circuit used in a radio communication apparatus can be miniaturized.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
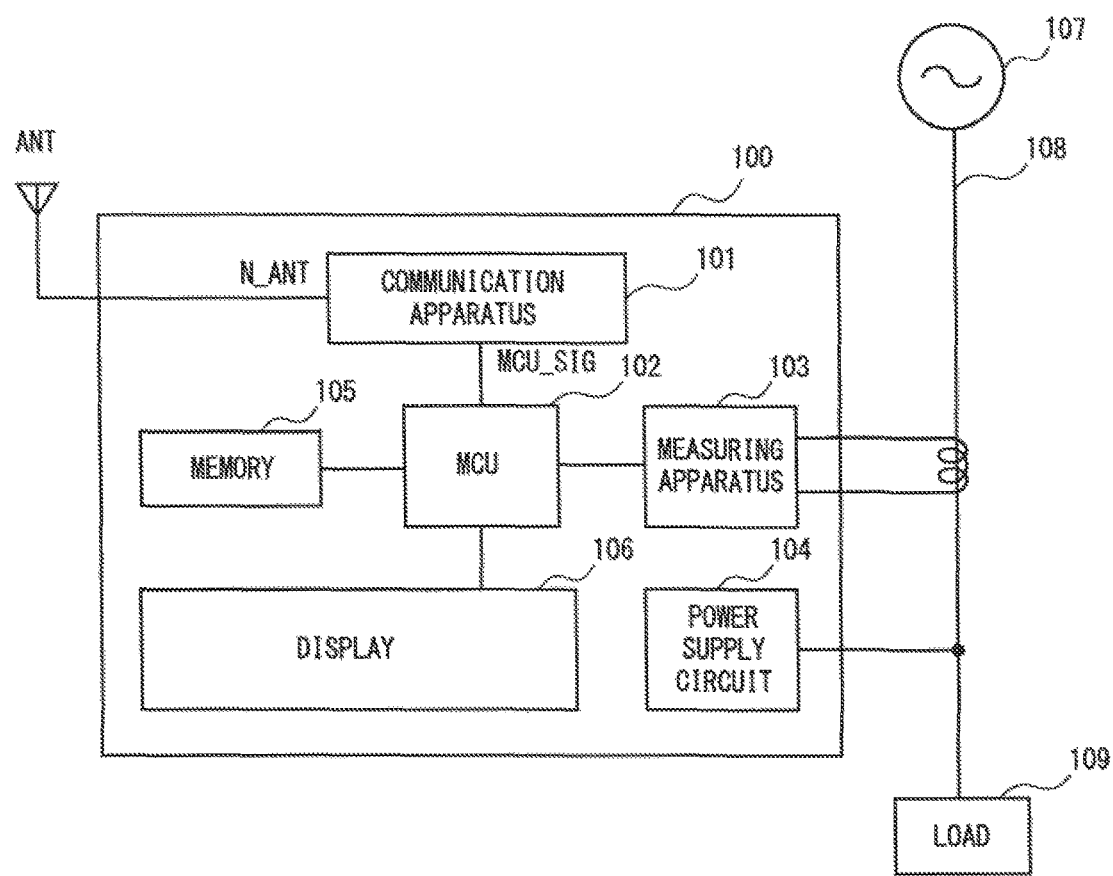
FIG. 1 is a block diagram for explaining a smart meter according to a first embodiment.

A smart meter according to a first embodiment shall be explained by referring to FIG. 1 as follows.
[Configuration of Smart Meter: FIG. 1]
As shown in FIG. 1, a smart meter 100 according to this embodiment includes a communication apparatus 101, an MCU (Microcontroller Unit) 102, a measuring apparatus 103, a power supply circuit 104, a memory 105, a display 106, and an antenna ANT. The smart meter 100 is an apparatus for measuring an amount of electricity supplied to a load 109 of a domestic power supply from a commercial power supply 107.

Figure 16:
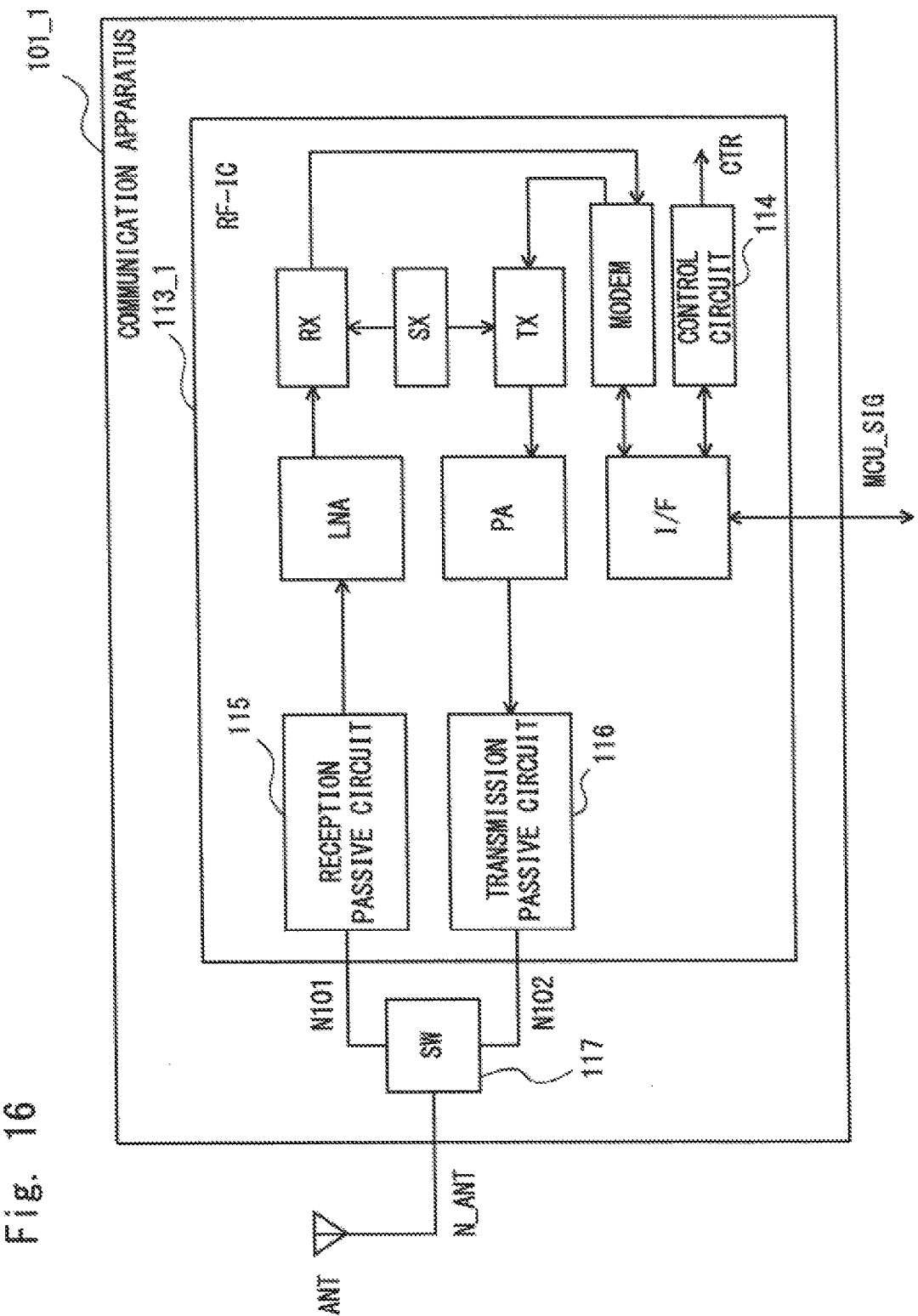
FIG. 16 is a block diagram showing an example of a communication apparatus according to related art.
Figure 17:
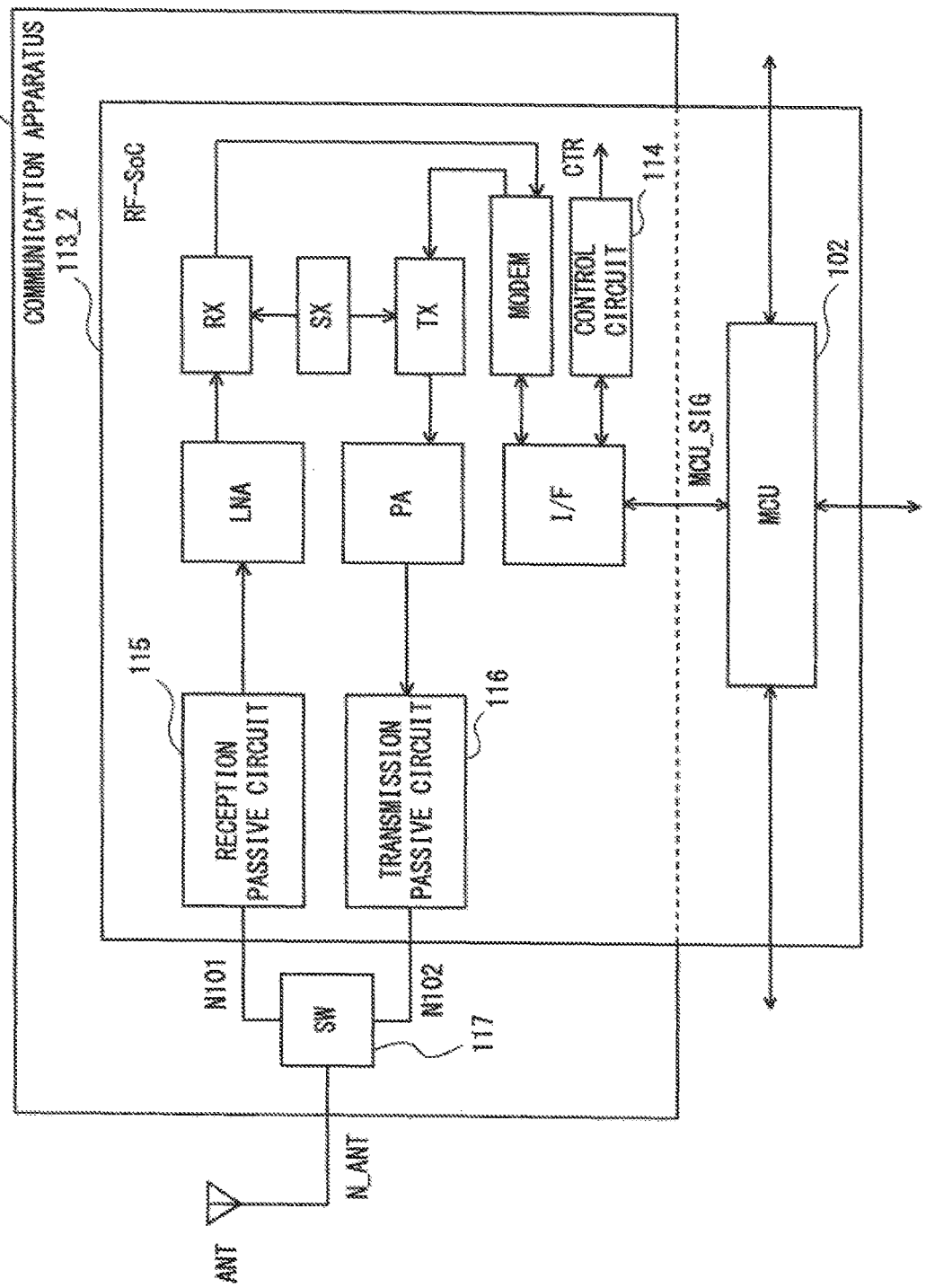
FIG. 17 is a block diagram showing another configuration example of the communication apparatus according to the related art.

The communication apparatus 101 sends information on the amount of electricity and the like that have been measured by the smart meter 100 to another device that is connected to an antenna node N_ANT via the antenna ANT. Further, the communication apparatus 101 receives predetermined information from the other device via the antenna ANT. The MCU (102) controls the communication apparatus 101, the measuring apparatus 103, the memory 105, and the display 106. For example, the MCU (102) supplies a signal MCU_SIG (a control signal or the like) to the communication apparatus 101. The measuring apparatus 103 measures an amount of electricity flowing through a line 108 and outputs information regarding the measured amount of electricity to the MCU (102). The MCU (102) stores the information regarding the measured amount of electricity that has been measured by the measuring apparatus 103 in the memory 105. The display 106 displays various information on the smart meter 100. For example, a liquid crystal display can be used for the display 106. For example, the communication apparatus 101 sends a record of electricity consumption that is stored in the memory 105 at the time of reading a meter or communicating with an HEMS (Home Energy Management System).
[Explanation of Related Art]
Next, related art of the communication apparatus 101 that is used by the smart meter shown in FIG. 1 shall be explained as follows by referring to FIGS. 16 to 19. FIG. 16 is a drawing for explaining the related art of the communication apparatus 101 that is used by the smart meter 100 shown in FIG. 1 and a block diagram showing an example of a communication apparatus according to the related art. As shown in FIG. 16, a communication apparatus 101_1 according to the related art includes a semiconductor integrated circuit 113_1. The semiconductor integrated circuit 113_1 is an integrated circuit for high frequencies and comprised of a semiconductor chip (RF-IC). The semiconductor integrated circuit 113_1 includes a reception passive circuit 115, a low-noise amplifier circuit LNA, a receiver circuit RX, a transmitter circuit TX, a transmission amplifier circuit PA, a transmission passive circuit 116, a local oscillator SX, a modem MODEM, a control circuit 114, and an interface I/F. Further, the communication apparatus 101_1 includes a switch circuit 117. This switch circuit 117 is provided outside the semiconductor integrated circuit 113_1 (the RF-IC).

The reception passive circuit 115 has a function to match an input impedance of the low-noise amplifier circuit LNA and a function as a filter circuit. The low-noise amplifier circuit LNA amplifies a reception signal (a radio signal) that is supplied from the reception passive circuit 115. The receiver circuit RX performs a reception process such as a down conversion on the reception signal that has been amplified by the low-noise amplifier circuit LNA. The modem MODEM demodulates the reception signal that has been supplied from the receiver circuit RX and supplies the demodulated reception signal to the MCU (102) shown in FIG. 1 via the interface I/F.

Further, a transmission signal is supplied from the MCU (102) shown in FIG. 1 to the modem MODEM via the interface I/F. The modem MODEM modulates the supplied transmission signal and supplies the modulated transmission signal to the transmitter circuit TX. The transmitter circuit TX performs a transmission process such as an up-conversion on the modulated transmission signal that has been supplied from the modem MODEM. The transmission amplifier circuit PA amplifies the transmission signal that has been supplied from the transmitter circuit TX. The transmission passive circuit 116 has a function to match an output impedance of the transmission amplifier circuit PA and a function as a filter circuit.

The switch circuit 117 switches between a connection of the antenna ANT and the reception passive circuit 115 and a connection of the antenna ANT and the transmission passive circuit 116. More specifically, the switch circuit 117 connects the antenna node N_ANT and an input node N101 of the reception passive circuit 115 at the time of a reception and connects the antenna node N_ANT and an output node N102 of the reception passive circuit 116 at the time of a transmission. Moreover, the control signal MCU_SIG is supplied to the control circuit 114 from the MCU (102) shown in FIG. 1 via the interface I/F. The control circuit 114 generates a control signal CTR in response to the control signal MCU_SIG and controls each circuit constituting the communication apparatus 101_1.

As shown in FIG. 16, in the communication apparatus 101_1, most of the functions are integrated into the semiconductor integrated circuit 113_1 (the semiconductor chip (RF-IC)). In the communication apparatus 101_1 shown in FIG. 16, the switch circuit 117 is comprised of a part that is different from parts constituting the semiconductor integrated circuit 113_1.

Note that it is often more than enough when a communication apparatus for a smart meter supports a single communication system in a single frequency band. A mobile phone, as an example, shall be explained for comparison with communication apparatus for a smart meter. In a mobile phone, a plurality of switch circuits (corresponding to the switch circuit 117) having eight to 16 ports are typically used to support a number of frequency bands and communication systems. On the other hand, as the switch circuit 117 having two ports is more than enough for the communication apparatus for the smart meter, the complexity of the switch circuit in the communication apparatus for the smart meter, greatly differs from that of the switch circuits in the mobile phone as being the same radio communication apparatus.
[Problem of Related Art]
In a smart meter, how to improve a component density has been continuously studied in order to miniaturize the circuit and reduce the cost. Especially in a communication apparatus used for the smart meter, as it is only necessary to support a single communication system in a single frequency band, a configuration of the apparatus can be greatly simplified by improving the integration thereof. For example, the communication apparatus 101_2 shown in FIG. 17 has a configuration with an improved integration and shows a case in which the semiconductor integrated circuit 113_1 (the RF-IC) shown in FIG. 16 and the MCU (102) constitute one semiconductor integrated circuit 113_2 (i.e., a semiconductor chip RF-SoC (Radio Frequency System on Chip).

When such an improvement in the integration of the configuration of the apparatus is made, the last part that can be integrated is the switch circuit 117. There are two reasons for this. The first reason is that as a characteristic impedance of a part into which the switch circuit 117 is inserted is an impedance of the antenna (typically 50Ω), a voltage amplitude of the transmission and reception signals will become large. In the case of, for example, a specified low power radio of a 920 MHz band which is commonly used by a smart meter, an upper limit of transmission power from a power amplifier is 13 dBm. At this time, when the impedance of the antenna is 50Ω, the voltage amplitude will be about 2.8 Vpp. In consideration of a signal reflection caused by, for example, a certain object touching the antenna, it is necessary to consider a voltage amplitude twice as great as 2.8 Vpp at most. This voltage amplitude is equivalent to one that is several times as great as a safe excitation voltage of a MOSFET (Metal-Oxide-Semiconductor Field-Effect Transistor) that has been manufactured by a process used for manufacturing the RF-IC and RF-SoC, which is a process for achieving miniaturization and a reduction in a voltage of a semiconductor chip. Therefore, a switch circuit that handles a switching of transmission and reception signals having such a large voltage amplitude requires a semiconductor IC that has been manufactured by a dedicated process which will be explained later.

The second reason is that as the antenna is formed to project near a surface of the smart meter or outside the smart meter, a strong resistance (a surge resistance) to Electro Static Discharge (ESD) is required. It is, however, not easy to ensure a strong surge resistance in the RF-IC and RF-SoC that has been manufactured by the process for achieving the miniaturization and reduction in the voltage.

Figure 18:
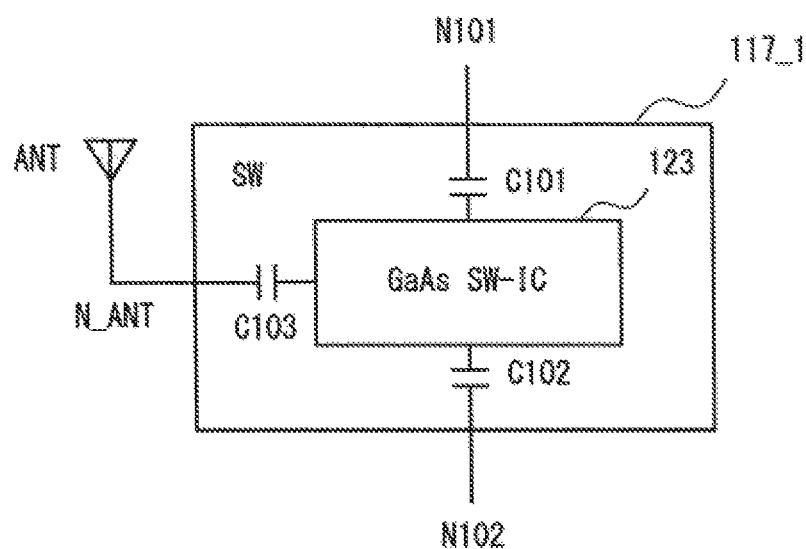
FIG. 18 is a drawing showing an example of a switch circuit used in the communication apparatus according to the related art.

Due to these reasons, a switch circuit that has been manufactured by a special manufacturing process is used for the switch circuit 117 in the communication apparatuses 101_1 and 101_2. FIG. 18 is a drawing showing an example of the switch circuit used in the related art. A switch circuit 117_1 shown in FIG. 18 is comprised of a switch IC (123) that has been manufactured by GaAs-related compound semiconductor processing and capacitive elements C101 to C103 that block a DC bias component leaking from the switch IC (123). As the RF-IC and RF-SoC that have been explained above are formed by silicon process technology, such a switch IC (123) that has been formed by the compound semiconductor processing cannot be integrated into the RF-IC and RF-SoC as it is.

Figure 19:
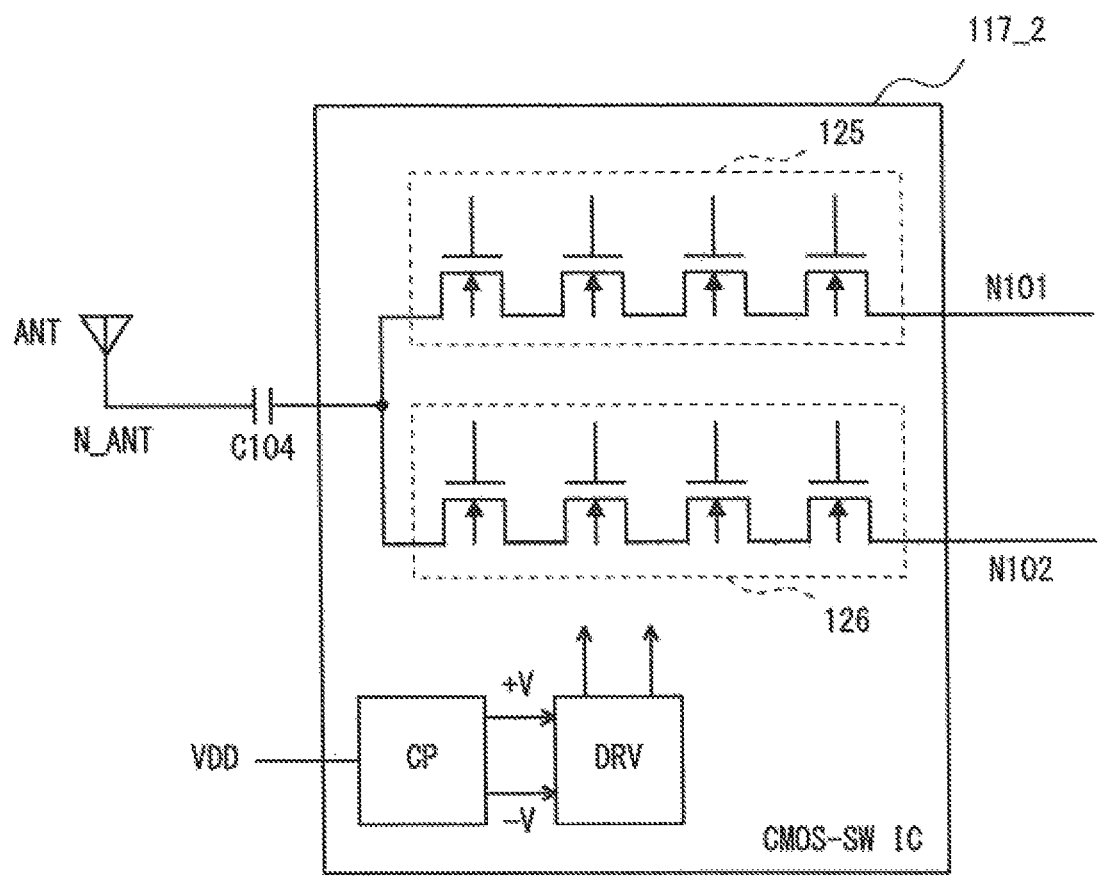
FIG. 19 is a drawing showing another configuration example of the switch circuit used in the communication apparatus according to the related art.

Moreover, a high-performance switch circuit manufactured using SOI (Silicon On Insulator)-CMOS technology has been used in recent years. FIG. 19 is a drawing showing another configuration example of a switch circuit used in the related art. A switch circuit 117_2 shown in FIG. 19 includes a switch/group 125 in which a plurality of N-type MOSFETs are connected in series and a switch group 126 in which a plurality of N-type MOSFETs are connected in series. The switch circuit 117_2 functions as an SPDT (Single Pole Dual Throw) switch. The switch circuit 117_2 shown in FIG. 19 includes a charge pump circuit CP for generating positive and negative bias voltages in order to switch the plurality of N-type MOSFETs and a drive circuit DRV for appropriately supplying the generated voltages to the switch groups 125 and 126. Although the switch circuit 117_2 can be formed using the same silicon process technology as that used to form the RF-IC and RF-SoC, it is difficult to integrate the switch circuit 117_2 for the following reason.

Specifically, although the RF-IC and RF-SoC use a bulk substrate, the switch circuit 117_2 shown in FIG. 19 needs to use an SOI substrate. Further, the RF-IC and RF-SoC use a miniaturization process for achieving miniaturization and a reduction in a voltage. However, the switch circuit 117_2 shown in FIG. 19 is manufactured by a process that can handle high voltages (a process in which technology of miniaturization is behind by a few generations) as voltage amplitudes of signals handled by the switch circuit 117_2 are large. Moreover, the switch circuit 117_2 shown in FIG. 19 requires the charge pump circuit CP and the drive circuit DRV. However, when the charge pump circuit CP and the drive circuit DRV are mounted together on the RF-IC and RF-SoC, operating noise of the charge circuit CP and the drive circuit DRV causes an adverse effect on a high-frequency transmission characteristic and high-frequency reception characteristic.

With a recognition of such a difficulty, when the switch circuit 117 is integrated using the process for achieving the miniaturization and reduction in the voltage which is used to manufacture the RF-IC and RF-SoC, a voltage amplitude of a signal that can be handled may be limited or the surge resistance may become insufficient. On the other hand, when a high-resistance MOSFET generally used for I/O is used in order to avoid the limitation in the voltage amplitude of the signal and the surge resistance, there are adverse effects such as a deterioration of RF characteristics, an increase in a chip area, and an increase in power consumption.

As has been explained above, in the communication apparatuses 101_1 and 101_2 according to the related art, the switch circuit for switching the connection of the antenna and the transmitter and receiver circuits has not been miniaturized enough due to reasons such as a size of a voltage amplitude of a high-frequency signal handled by the switch circuit and a resistance to ESD. Accordingly, there has been a problem that the semiconductor integrated circuit used in the radio communication apparatus has not been sufficiently miniaturized. A semiconductor integrated circuit that can solve such a problem shall be explained as follows.

Figure 2:
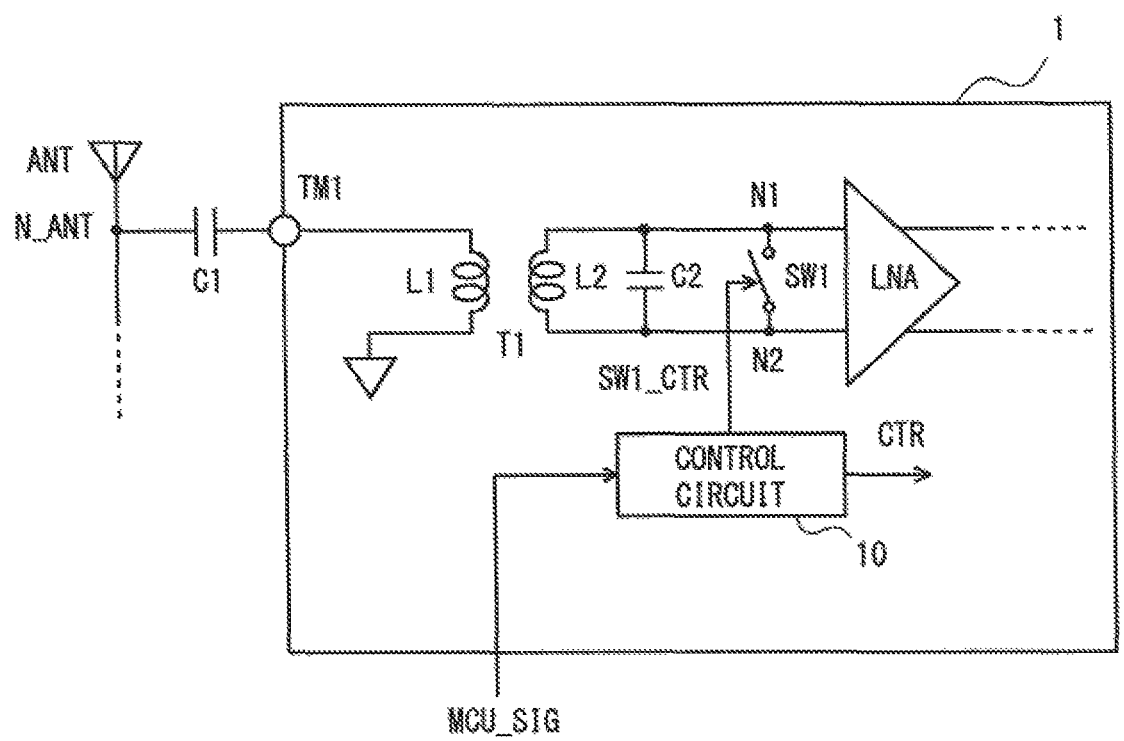
FIG. 2 is a circuit diagram showing an example of a semiconductor integrated circuit according to the first embodiment.

[Configuration of Semiconductor Integrated Circuit: FIG. 2]

FIG. 2 is a circuit diagram showing an example of a semiconductor integrated circuit according to a first embodiment. As shown in FIG. 2, a semiconductor integrated circuit 1 according to this embodiment includes a transformer T1 including a winding L1 and a winding L2, a capacitive element C2, a switch SW1, a low-noise amplifier circuit LNA, and a control circuit 10. These components are integrated into, for example, the RF-IC or RF-SoC. A capacitive element C1 is provided between an antenna node N_ANT and an input terminal TM1 of the semiconductor integrated circuit 1. The semiconductor integrated circuit 1 according to this embodiment can be used for the communication apparatus 101 of the smart meter 100 that has been explained above.

Components other than those mentioned above in the semiconductor integrated circuit 1, namely, the low-noise amplifier circuit LNA and the circuits and the like in the subsequent stages of the low-noise amplifier circuit LNA, are the same as those in the communication apparatus 101_1 according to the related art shown in FIG. 16. As these components are not characterizing parts of the semiconductor integrated circuit 1 according to this embodiment, descriptions thereof shall be omitted. Further, another circuit (typically a transmitter circuit) that is different from the semiconductor integrated circuit 1 is connected in parallel to the antenna node N_ANT. Note that a configuration including a transmitter circuit in the semiconductor integrated circuit (FIG. 6) shall be explained later.

As shown in FIG. 2, one end of the winding L1 of the transformer T1 is connected to the input terminal TM1, and the other end of the winding L1 of the transformer T1 is grounded (grounded in an alternating current manner). One end of the winding L2 of the transformer T1 (a node N1) and the other end of the winding L2 of the transformer T1 (a node N2) are connected respectively to input terminals of the low-noise amplifier circuit LNA. The capacitive element C2 and the switch SW1 are connected in parallel between the one end and the other end of the winding L2 of the transformer T1. Note that the capacitive element C2 may be omitted depending on a value of an input impedance of the low-noise amplifier circuit LNA.

Figure 3:
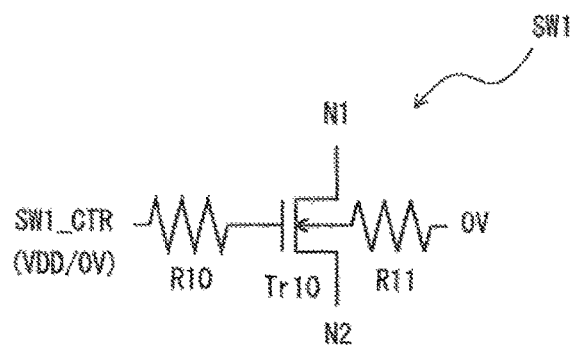
FIG. 3 is a circuit diagram showing an example of a switch used in the semiconductor integrated circuit according to the first embodiment.

FIG. 3 is a circuit diagram showing an example of the switch SW1. The switch SW1 can be comprised of, for example, an N-type MOSFET (Tr10) and resistors R10 and R11. The drain and source of the MOSFET (Tr10) are connected respectively to the node N1 and the node N2 of the winding L2 of the transformer T1. A 0 V DC bias is applied to a body of the MOSFET (Tr10) via the resistor R11. A control signal SW1_CTR (a voltage VDD or 0 V) is applied to the gate of the MOSFET (Tr10) via the resistor R10.

That is, when the voltage VDD is applied to the gate of the MOSFET (Tr10), the MOSFET (Tr10) will be ON (the switch SW1 will be in a closed state). On the other hand, when 0 V is applied to the gate of the MOSFET (Tr10), the MOSFET (Tr10) will be OFF (the switch SW1 will be in an opened state). Note that as the switch SW1 should only be opened or closed for an RF signal, the source and the drain of the MOSFET (Tr10) may be capacitively coupled to the node N1 and the node N2 of the winding L2 of the transformer T1, respectively. Moreover, a P-type MOSFET may be used in place of the N-type MOSFET (Tr10).

The control circuit 10 applies the voltage VDD or a voltage of 0 V to the gate of the NMOS transistor Tr10 as the control signal SW1_CTR of the switch SW1. Further, the control circuit 10 supplies a control signal CTR to each circuit (not shown) included in the semiconductor integrated circuit 1. A control signal MCU_SIG is supplied to the control circuit 10 from the MCU (102) shown in FIG. 1.

[Operation of Semiconductor Integrated Circuit]

Next, an operation of the semiconductor integrated circuit 1 shall be explained as follows.

The semiconductor integrated circuit 1 according to this embodiment causes the transformer T1 to function as an input impedance matching circuit for the low-noise amplifier circuit LNA by opening the switch SW1 in a period when a reception signal is supplied to the winding L1 of the transformer T1 from the antenna ANT (a predetermined node). In the semiconductor integrated circuit 1 shown in FIG. 2, the capacitive element C1 and the capacitive element C2 in addition to the transformer T1 constitute the input impedance matching circuit for the low-noise amplifier circuit LNA.

On the other hand, in a period when another circuit connected to the antenna ANT (the predetermined node) operates, the switch SW1 is closed. In this case, an impedance when the capacitive element C1 side is viewed from the antenna ANT side will become equivalent to an impedance of a sufficiently small capacitive element. Note that when the other circuit connected to the antenna ANT is a transmitter circuit, operations of the semiconductor integrated circuit 1 (a receiver circuit) and the other circuit (the transmitter circuit) will become the same as those shown in timing charts of FIGS. 7 and 8 (the operations shown in FIGS. 7 and 8 shall be explained later).

At this time, by appropriately selecting circuit constants of the transformer T1 and the capacitive elements C1 and C2, the input impedance of the low-noise amplifier circuit LNA can be matched in a state where the switch SW1 is opened, and the impedance when the semiconductor integrated circuit 1 side is viewed from the antenna ANT side can be configured to become equivalent to the impedance of the sufficiently small capacitance in a state where the switch SW1 is closed.

Specifically, in the state where the switch SW1 is opened, a reception passive circuit including the transformer T1 can be in a state suitable for a reception operation. On the other hand, in the state where the switch SW1 is closed, an influence of the reception passive circuit including the transformer T1 on the other circuit can be ignored when the semiconductor integrated circuit 1 is viewed from the other circuit connected to the antenna ANT, or an equivalent capacitance (the sufficiently small capacitance) when the semiconductor integrated circuit 1 is viewed from the antenna ANT side can function by including the equivalent capacitance in one of the components of the impedance matching circuit for the other circuit.

To be more specific, in the semiconductor integrated circuit 1 shown in FIG. 2, consider a case in which values of a complex input impedance of the low-noise amplifier circuit LNA, a capacitance C1 of the capacitive element C1, an inductance L1 of the winding L1, and a coupling coefficient k of the transformer T1 are provided beforehand. In this case, the degree of freedom remains in two values which are: values of an inductance L2 of the winding L2 and a capacitance C2 of the capacitive element C2. Accordingly, under such a constraint condition, an impedance can be made to match the complex impedance of the low-noise amplifier circuit LNA (=degree of freedom 2).

Figure 4:
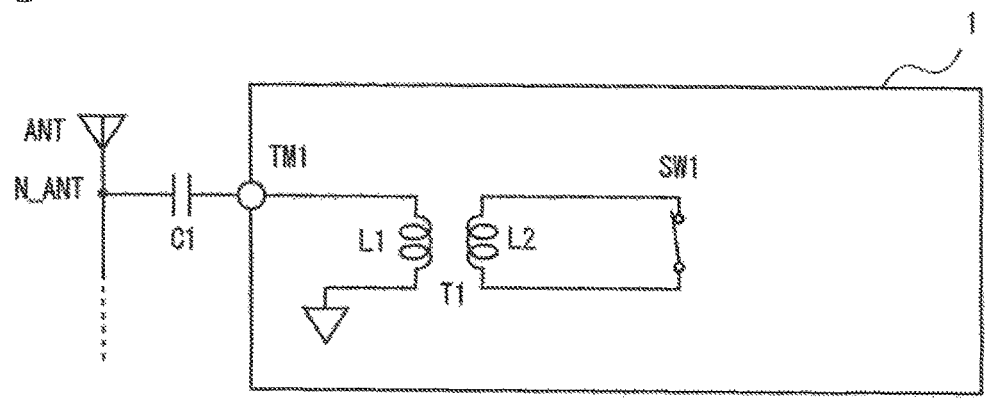
FIG. 4 is a drawing for explaining an operation of the semiconductor integrated circuit according to the first embodiment (when the switch is in a closed state)
Figure 5:
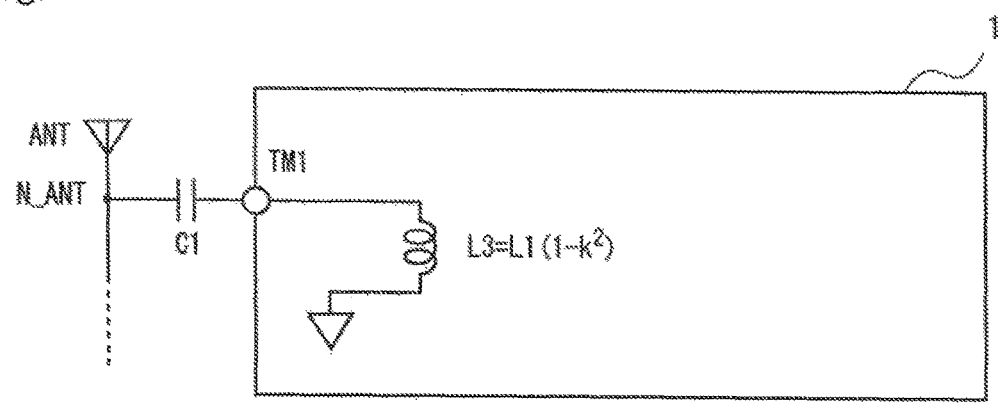
FIG. 5 is a drawing for explaining an operation of the semiconductor integrated circuit according to the first embodiment (when the switch is in the closed state)

Further, when the switch SW1 is closed, the capacitive element C2 and the low-noise amplifier circuit LNA that are connected in parallel to the switch SW1 can be ignored. That is, when the switch SW1 is closed, a circuit shown in FIG. 4 may be considered. In such a case, an equivalent circuit viewed from the antenna ANT side will become the one shown in FIG. 5. More specifically, the impedance viewed from the antenna ANT side is $1/j\omega C1+j\omega L1(1-k^2)$. At an angular frequency of the RF signal, $1/j\omega C3=1/j\omega C1+j\omega L1(1-k^2)$. As the values of C1, L1, and k can be arbitrarily determined regardless of the input impedance matching of the low-noise amplifier circuit LNA, by appropriately selecting these values, a value of C3 can be set as being a sufficiently small predetermined value.

Therefore, when viewed from the other circuit that is connected to the antenna ANT, the input terminal TM1 of the semiconductor integrated circuit 1 when the switch SW1 is closed can be seen as being equivalent to the capacitance C3. When the value of the capacitance C3 is set as being a sufficiently small value, an influence on the other circuit can be ignored. Moreover, the capacitance C3 can be incorporated as one of components of the impedance matching circuit for the other circuit.

As described above, the semiconductor integrated circuit 1 according to this embodiment can achieve a state as if an input unit (the input terminal TM1) of the semiconductor integrated circuit 1 is separated from the antenna ANT without using the switch circuit (see FIGS. 16 to 19) that is inserted in series in an RF signal path.

Further, the one end of the winding L1 of the primary side of the transformer T1 is directly connected to the input terminal TM1 of the semiconductor integrated circuit 1 (the RF-IC), and the other end of the winding L1 of the transformer T1 is grounded. An inductance of the primary side of the transformer T1 is typically about several nH. As a thick wire is used for the windings of the transformer T1, it is not necessary to separately provide an ESD protection circuit in order to ensure a surge resistance, and even when the ESD protection circuit is required, only a simple ESD protection circuit is sufficient. That is, by directly connecting the input terminal TM1 of the semiconductor integrated circuit 1 (the RF-IC) to the winding L1 of the primary side of the transformer T1, a strong surge resistance can be ensured. Further, as it is not necessary to provide the ESD protection circuit, a chip area of the semiconductor integrated circuit 1 can be reduced by an area corresponding to that of the ESD protection circuit. Additionally, a parasitic capacitance caused by the ESD protection circuit can be reduced.

The switch SW1 that is connected to the winding L2 of the secondary side of the transformer T1 becomes the opened state when the semiconductor integrated circuit 1 performs a reception operation. As a maximum value of received power of the semiconductor integrated circuit 1 is typically small, which is about −20 dBm, a voltage amplitude applied when the switch SW1 is in the opened state is in a degree that can be handled by a MOSFET (see FIG. 3) constituting the switch SW1. When the other circuit connected to the antenna ANT is a transmitter circuit, a large voltage amplitude is applied to the input terminal TM1 of the semiconductor integrated circuit 1 (the RF-IC) in a state of a transmission. However, as the switch SW1 is in the closed state at this time, the voltage amplitude applied to the switch SW1 is almost zero. Thus, a MOSFET that has been formed by a miniaturizing process for achieving miniaturization and a reduction in a voltage can be used for the switch SW1.

In addition, it is preferable to close the switch SW1 except when the semiconductor integrated circuit 1 performs the reception operation. In general, the input impedance of the low-noise amplifier circuit LNA is greater than impedances of antennas (typically 50Ω), the transformer T1 is designed in such a way that an impedance will increase gradually from the antenna ANT side toward the low-noise amplifier circuit LNA side. Accordingly, an ON resistance required for the switch SW1 can be greater than that of the switch circuit 117 (see FIG. 16) that is disposed proximate to the antenna ANT according to the related art. Further, as the miniaturization process is used to manufacture the RF-IC and RF-SoC, even when an area of the MOSFET is small, a sufficiently low ON resistance can be achieved. As a result, the area of the switch SW1 can be smaller than in the related art. Moreover, a parasitic capacitance caused by the switch SW1 can be reduced as well.

As has been explained above, as the semiconductor integrated circuit 1 according to this embodiment has the above-explained configuration, it is not necessary to use the switch circuit 117 (FIGS. 18 and 19) that have been used in the related art. It is therefore possible to achieve the miniaturization of the semiconductor integrated circuit used in the radio communication apparatus.

Figure 6:
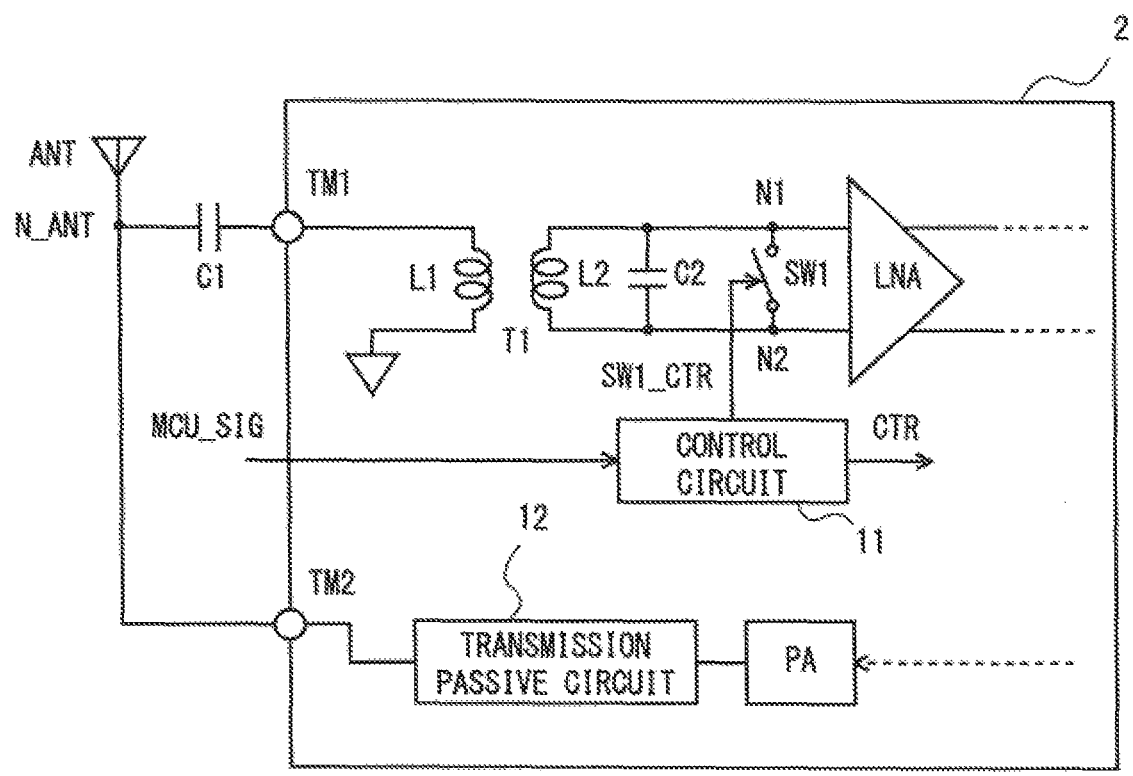
FIG. 6 is a circuit diagram showing another configuration example of the semiconductor integrated circuit according to the first embodiment.

[Another Configuration Example of Semiconductor Integrated Circuit: FIG. 6]

Next, another configuration example of the semiconductor integrated circuit according to this embodiment shall be explained as follows. FIG. 6 is a circuit diagram showing another configuration example of the semiconductor integrated circuit according to this embodiment. A difference between a semiconductor integrated circuit 2 shown in FIG. 6 and the semiconductor integrated circuit 1 shown in FIG. 2 is that the semiconductor integrated circuit 2 shown in FIG. 6 includes a circuit of a transmission system such as a transmission passive circuit 12, a transmission amplifier PA and the like. As the configurations other than these mentioned above are the same as those of the semiconductor integrated circuit 1 shown in FIG. 2, repeated explanations shall be omitted.

As shown in FIG. 6, the semiconductor integrated circuit 2 includes the transformer T1 including the windings L1 and L2, the capacitive element C2, the switch SW1, the low-noise amplifier circuit LNA, a control circuit 11, the transmission passive circuit 12, and the transmission amplifier PA. These components are integrated into, for example, the RF-IC or RF-SoC.

A circuit of a transmission system including the transformer T1, the capacitive element C2, the switch SW1, and the low-noise amplifier circuit LNA is connected to the antenna ANT via the input terminal TM1. The capacitive element C1 is provided between the antenna node N_ANT and the input terminal TM1. Further, a circuit of a transmission system including the transmission passive circuit 12 and the transmission amplifier PA is connected to the antenna node N_ANT via an output terminal TM2. For example, the semiconductor integrated circuit 2 shown in FIG. 6 can be used for the communication apparatus 101 of the related art that has been explained above.

Other components in the semiconductor integrated circuit 2 which are the low-noise amplifier circuit LNA and the circuits in the subsequent stages of the low-noise amplifier LNA and the circuits in the preceding stages of the transmission amplifier PA are the same as those in the communication apparatus 101_1 according to the related art shown in FIG. 16. As those components are not characterizing parts of the semiconductor integrated circuit 2 according to this embodiment, descriptions thereof shall be omitted. Further, in the semiconductor integrated circuit 2 shown in FIG. 6, the control circuit 11 supplies a control signal also to the circuit of the transmission system. Note that in this embodiment, the transmission amplifier PA may be configured to supply a differential transmission signal to the transmission passive circuit 12 or the transmission amplifier PA may be configured to supply a single-phase transmission signal to the transmission passive circuit 12.

[Operation of Semiconductor Integrated Circuit Shown in FIG. 6]

The semiconductor integrated circuit 2 shown in FIG. 6 causes the switch SW1 to be in the opened state and the transformer T1 to function as an input impedance matching circuit for the low-noise amplifier circuit LNA in a period in which a reception signal is supplied to the winding L1 of the transformer T1 from the antenna ANT (a reception operation period). In the semiconductor integrated circuit 2 shown in FIG. 6, the capacitive element C1 and the capacitive element C2 in addition to the transformer T1 constitute the input impedance matching circuit for the low-noise amplifier circuit LNA.

On the other hand, the switch SW1 is closed in a period in which the circuit of the transmission system including the transmission passive circuit 12 and the transmission amplifier PA operates (a transmission operation period). In this case, an impedance when the capacitive element C1 side is viewed from the antenna ANT side will become equivalent to the impedance of the sufficiently small capacitive element. Accordingly, the circuit of the transmission system including the transmission passive circuit 12 and the transmission amplifier PA can normally execute a transmission operation.

Figure 7:
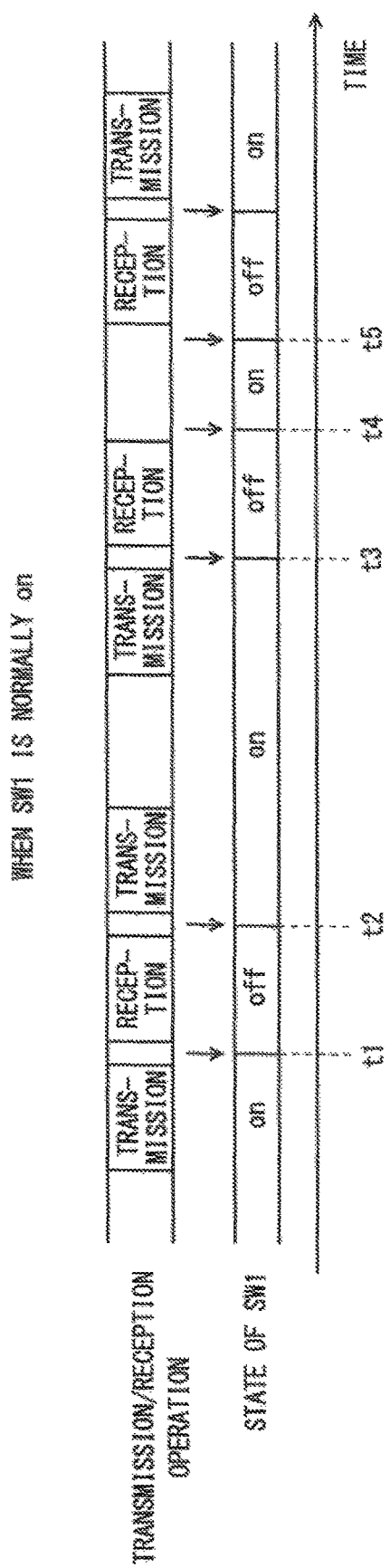
FIG. 7 is a timing chart for explaining the operation of the semiconductor integrated circuit according to the first embodiment.

Next, an operation of the semiconductor integrated circuit 2 shown in FIG. 6 shall be explained in more detail. FIG. 7 is a timing chart for explaining the operation of the semiconductor integrated circuit 2. The timing chart shown in FIG. 7 shows a case in which a normally on switch is used for the switch SW1 of the semiconductor integrated circuit 2. When the normally on switch is used for the switch SW1, and a control signal SW1_CTR that is output from the control circuit 11 is a low level one, the state of the switch SW1 will be ON (the closed state). At this time, the state of the semiconductor integrated circuit 2 will become a state capable of performing the transmission operation. On the other hand, when the control signal SW_CTR that is output from the control circuit 11 is a high level one, the switch SW1 will be OFF (the opened state). At this time, the state of the semiconductor integrated circuit 2 will become a state capable of performing a reception operation.

More specifically, when the normally on switch is used for the switch SW1, at timings t1 and t3 which are immediately before the semiconductor integrated circuit 2 performs the reception operation, the switch SW1 is turned off (the opened state), so that the semiconductor integrated circuit 2 will be in the state capable of performing the reception operation. Then, at timings t2 and t4 which are after the semiconductor integrated circuit 2 has completed the reception operation, the switch SW1 is turned on (the closed state), so that the semiconductor integrated circuit 2 will be in the state capable of performing the transmission operation. Note that when the semiconductor integrated circuit 2 does not perform both the reception and transmission operations, as the switch SW1 is normally on, the switch SW1 is turned on (the closed state) (see, for example, timings t4 to t5).

Figure 8:
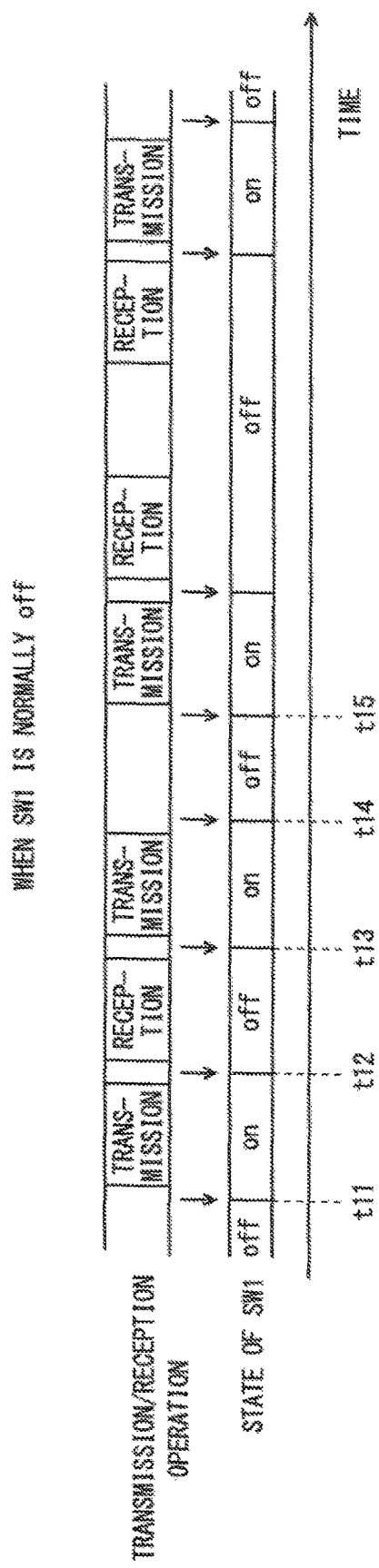
FIG. 8 is a timing chart for explaining the operation of the semiconductor integrated circuit according to the first embodiment.

FIG. 8 is a timing chart for explaining the operation of the semiconductor integrated circuit 2 and shows a case in which a normally off switch is used for the switch SW1 of the semiconductor integrated circuit 2. When the normally off switch is used for the switch SW1, and the control signal SW1_CTR that is output from the control circuit 11 is a low level one, the switch SW1 will become the OFF state (the opened state). At this time, the semiconductor integrated circuit 2 will be in the state capable of performing the reception operation. On the other hand, when the control signal SW1_CTR that is output from the control circuit 11 is a high level, the switch SW1 is turned on (the closed state). At this time, the semiconductor integrated circuit 2 will be in the state capable of performing the transmission operation.

More specifically, when the normally off switch is used for the switch SW1, at timings t11 and t13 which are immediately before the semiconductor integrated circuit 2 performs the transmission operation, the switch SW1 is turned on (the closed state), so that the semiconductor integrated circuit 2 will be in the state capable of performing the transmission operation. Then, at timings t12 and t14 which are after the semiconductor integrated circuit 2 has completed the transmission operation, the switch SW1 is turned off (the opened state), so that the semiconductor integrated circuit 2 will be in the state capable of performing the reception operation. Note that when the semiconductor integrated circuit 2 does not perform either of the reception and transmission operations, as the switch SW1 is normally off, the switch SW1 is turned off (the opened state) (see, for example, timings t14 to t15).

[Mounting Example of Semiconductor Integrated Circuit: FIGS. 9 to 12]

Figure 9:
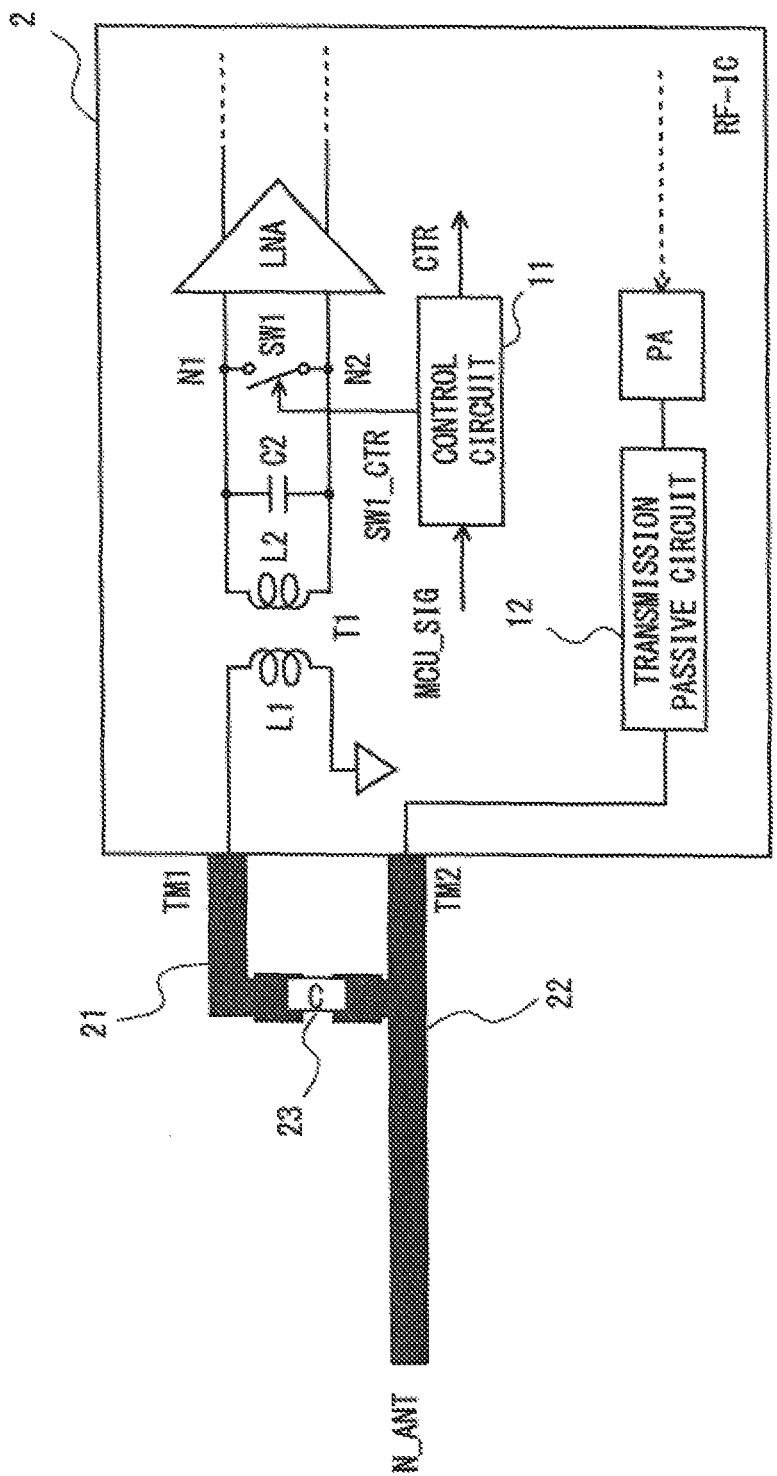
FIG. 9 is a drawing showing a mounting example of the semiconductor integrated circuit according to the first embodiment.
Figure 10:
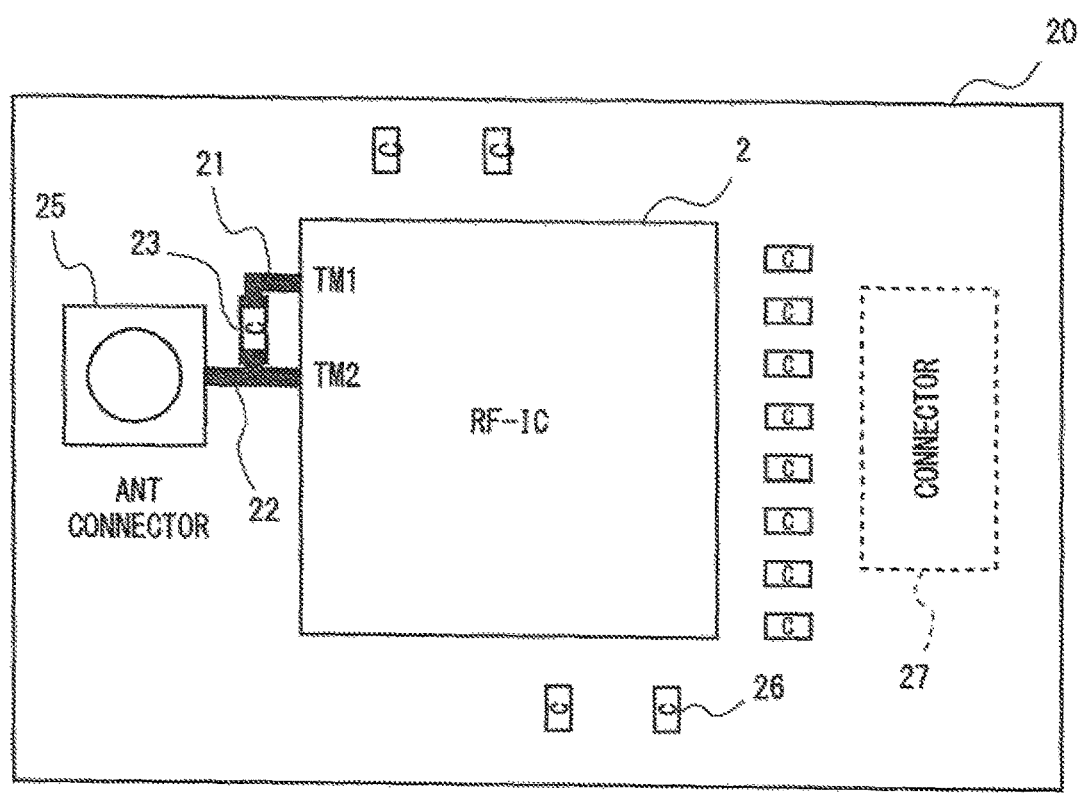
FIG. 10 is a drawing showing a mounting example of the semiconductor integrated circuit according to the first embodiment.

Next, a mounting example of the semiconductor integrated circuit according to this embodiment shall be explained by referring to FIGS. 9 and 10. As shown in FIG. 9, the semiconductor integrated circuit 2 is comprised of a semiconductor chip (RF-IC), and each component is integrated into the semiconductor chip. The input terminal TM1 of the semiconductor integrated circuit 2 and one end of a capacitive element (a chip capacitance) 23 are connected using a line 21 for high frequencies. The output terminal TM2 of the semiconductor integrated circuit 2 and the other end of the capacitive element 23 are connected using a line 22. The line 22 is connected to the antenna node N_ANT.

FIG. 10 is a drawing showing a communication module 20 in which the semiconductor integrated circuit 2 (the semiconductor chip) shown in FIG. 9 is mounted on a mounting substrate. As shown in FIG. 10, the semiconductor integrated circuit 2 (the semiconductor chip) is mounted on the mounting substrate. The line 22 that is connected to the semiconductor integrated circuit 2 is connected to an antenna connector 25. A plurality of capacitive elements (chip capacitances) 26 are arranged on the mounting substrate. Further, a connector 27 which is connected to the MCU (102*b*) (see FIG. 1) is disposed on a back side of the mounting substrate. As shown in FIG. 10, in the communication module 20, as most of functions are concentrated on the semiconductor integrated circuit 2 (the semiconductor chip), the number of necessary components other than the semiconductor integrated circuit 2 can be a few, such as the antenna connector 25, the capacitive elements (the chip capacitances) 26, and the connector 27. Note that in FIGS. 9 and 10, a power supply line, a ground line, a control line and the like are not shown.

Figure 11:
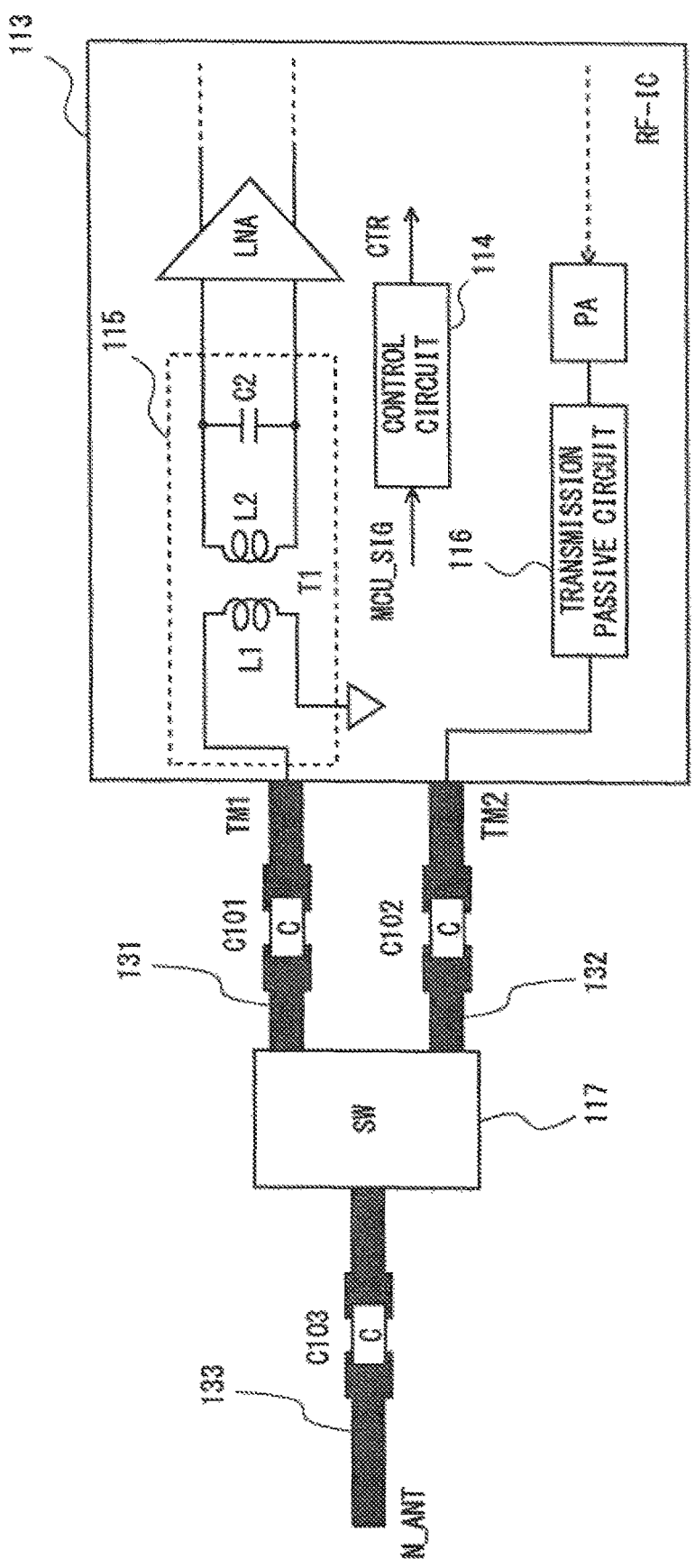
FIG. 11 is a drawing showing a mounting example of a semiconductor integrated circuit according to a comparative example.
Figure 12:
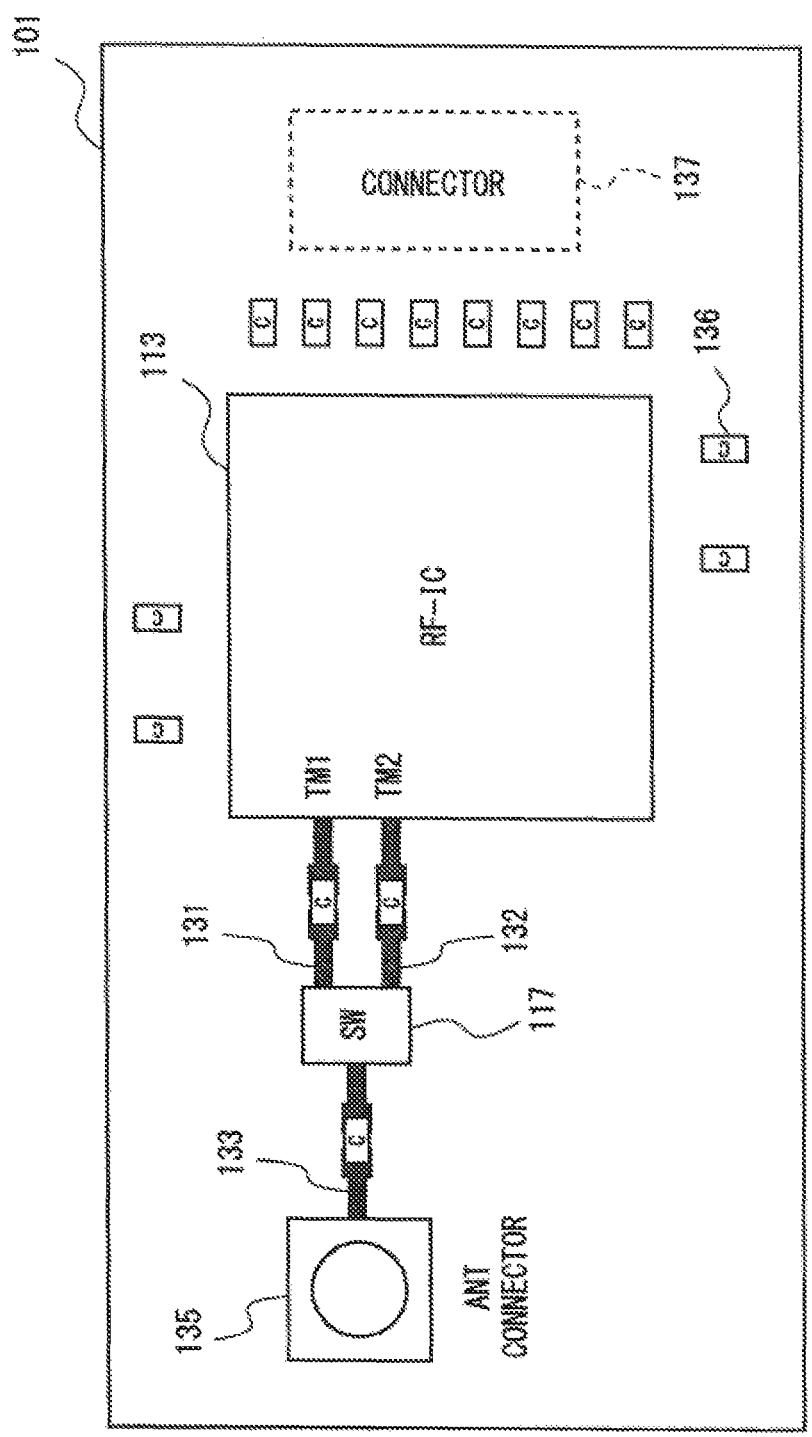
FIG. 12 is a drawing showing a mounting example of the semiconductor integrated circuit according to the comparative example.

FIGS. 11 and 12 are drawings showing mounting examples of a semiconductor integrated circuit 113 according to a comparative example. The semiconductor integrated circuit 113 corresponds to the semiconductor integrated circuit 113_1 shown in FIG. 16. Therefore, when the semiconductor integrated circuit 113 is used, the switch circuit 117 shown in FIG. 16 will be necessary. Further, when the switch circuit 117 is formed using GaAs technology, three capacitive elements (chip capacitances) are required so as to block a DC component leaking from the switch circuit 117 (see FIG. 18 for the details).

As shown in FIG. 11, the semiconductor integrated circuit 113 is comprised of a semiconductor chip (an RF-IC), and each component is integrated into the semiconductor chip. The input terminal TM1 of the semiconductor integrated circuit 113 and the switch circuit 117 are connected using a line 131. The capacitive element C101 (the chip capacitance) is provided between the input terminal TM1 and the switch circuit 117. The output terminal TM2 of the semiconductor integrated circuit 113 and the switch circuit 117 are connected using a line 132. The capacitive element C102 (the chip capacitance) is provided between the output terminal TM2 and the switch circuit 117. The switch circuit 117 and the antenna node N_ANT are connected using a line 133. The capacitive element C103 (the chip capacitance) is provided between the switch circuit 117 and the antenna node N_ANT.

FIG. 12 is a drawing showing a communication module 101 in which the semiconductor integrated circuit 113 (the semiconductor chip) shown in FIG. 11 is mounted on a mounting substrate. As shown in FIG. 12, the semiconductor integrated circuit 113 (the semiconductor chip) is mounted on the mounting substrate. The line 133 is connected to an antenna connector 135. A plurality of capacitive elements (chip capacitances) 136 are arranged on the mounting substrate. Further, a connector 137 which is connected to the MCU (102) (see FIG. 1) is disposed on a back side of the mounting substrate. Note that in FIGS. 11 and 12, a power supply line, a ground line, a control line and the like are not shown.

The communication module 101 shown in FIG. 12 requires the switch circuit 117, and the three capacitive elements (the chip capacitances) are required so as to block a DC component leaking from the switch circuit 117. This largely increases an area of the communication module 101. On the other hand, in the communication module 20 shown in FIG. 10, as the switch circuit 117 and two capacitive elements can be omitted, an area of the communication module 20 can be reduced by areas of the switch circuit 117 and the two capacitive elements. Note that as shown in FIG. 9, in the semiconductor integrated circuit 2, in place of the switch circuit 117, the switch SW1 will be needed. However, as the switch SW1 can be comprised of, for example, a CMOS (Complementary Metal Oxide Semiconductor) or the like, an area of the switch SW1 can be small enough in comparison to other circuit components constituting the reception circuit.

Figure 13:
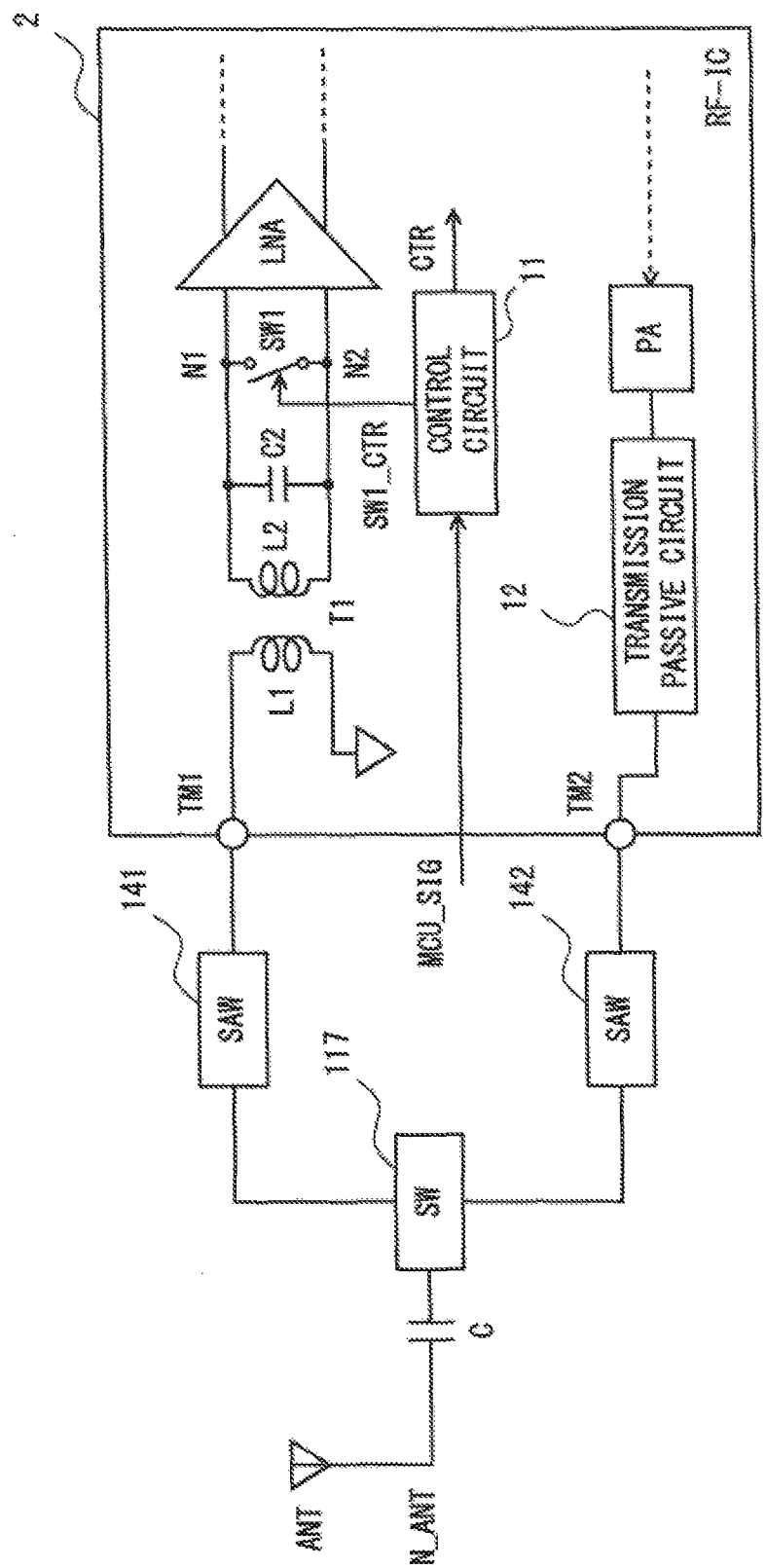
FIG. 13 is a drawing showing another mounting example of the semiconductor integrated circuit according to the first embodiment.

[Another Mounting Example of Semiconductor Integrated Circuit: FIG. 13]

Next, versatility of the semiconductor integrated circuit according to this embodiment shall be explained. It is common to provide a SAW (Surface Acoustic Wave) filter in a transmission side, a reception side or both the transmission and reception sides when there is a strict regulation on an unwanted wave of a transmission signal or when a strong interference wave is expected in the vicinity of a reception signal band.

FIG. 13 is a drawing showing another mounting example of the semiconductor integrated circuit according to this embodiment and shows a configuration in which the SAW filters are provided in both the transmission and reception sides. The configuration shown in FIG. 13 requires the switch circuit 117 in order to switch between a connection of the transmission side and an antenna node N_ANT and a connection of the reception side and the antenna node N_ANT. A SAW filter 141 is provided between the input terminal TM1 of the reception side and the switch circuit 117. Additionally, a SAW filter 142 is provided between the output terminal TM2 of the transmission side and the switch circuit 117.

Although in the semiconductor integrated circuit 2 (the semiconductor chip) shown in FIG. 6, the switch SW1 is provided in the path of the reception signal, the size of the switch SW1 is small. Accordingly, even when the semiconductor integrated circuit 2 (the semiconductor chip) shown in FIG. 6 is used for the communication apparatus including the SAW filters shown in FIG. 13, there is no disadvantage at all in terms of characteristics, a cost, and a circuit area. Therefore, the same semiconductor integrated circuit 2 (the semiconductor chip) can be used for the communication apparatus shown in FIG. 6 (the configuration having no SAW filter) and the communication apparatus shown in FIG. 13 (the configuration having the SAW filters).

The functions of the semiconductor chips such as the RF-IC and RF-SoC in recent years are further complicated. Thus, a benefit that the same semiconductor chip can be used for a plurality of usages in a manner explained above is significant for manufacturers and users of the semiconductor chips. To be more specific, for the manufacturers of the semiconductor chips, a cost, time and the like for a verification at the time of a product design, a reliability test for quality assurance, management of a production volume, inventory management after production, and preparation and maintenance of various documents can be reduced. For the users of the semiconductor chips, a cost and time for a basic performance verification at the time of introducing the semiconductor chip, an evaluation on an operation combined with software, a reliability verification, and management of stocks on hand at the time of production can be reduced.

As has been explained above, as the semiconductor integrated circuit 2 according to this embodiment can be used for the communication apparatus having various configurations, the semiconductor integrated circuit 2 according to this embodiment is versatile. In this case, there is no disadvantage in terms of characteristics, a cost, and a circuit area of the communication apparatus in a manner similar to the above case. Accordingly, a semiconductor integrated circuit can be commonly used in a smart meter using the technique according to this embodiment and the smart meter according to the related art. This saves a total cost for configuring the smart meter, the time and the like required for development etc.

Figure 14:
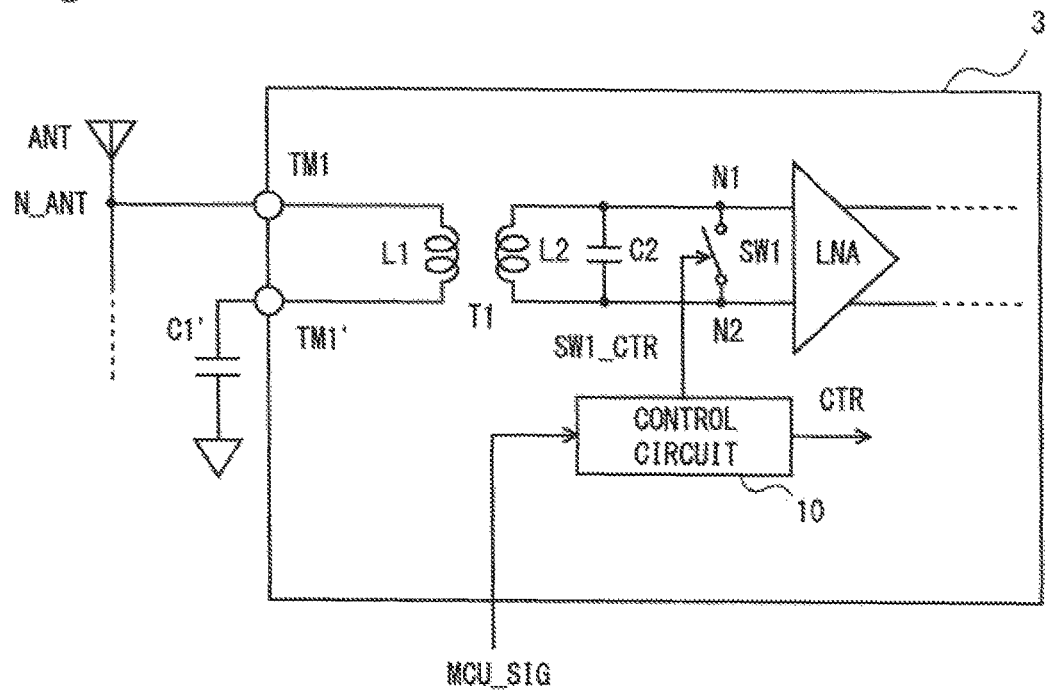
FIG. 14 is a circuit diagram showing another mounting example of the semiconductor integrated circuit according to the first embodiment.

[Another Configuration Example of Semiconductor Integrated Circuit: FIG. 14]

Next, another configuration example of the semiconductor integrated circuit according to this embodiment shall be explained by referring to FIG. 14. The semiconductor integrated circuit 1 shown in FIG. 2 has the configuration in which the capacitive element C1 is provided between the antenna node N_ANT and the input terminal TM1. However, in this embodiment, as in a semiconductor integrated circuit 3 shown in FIG. 14, a capacitive element C1' may be provided between a terminal TM1' and a ground potential. The terminal TM1' is connected to the other end of the winding L1. Further, the capacitive element C1' is provided outside the semiconductor integrated circuit 3.

That is, as shown in FIGS. 2 and 14, in the semiconductor integrated circuit according to this embodiment, the capacitive element C1 (C1') that is connected in series to the winding L1 of the transformer T1 may be provided, and a position on which the capacitive element is provided may be arbitrarily determined. At this time, a reception signal is supplied from the antenna ANT to one end of a circuit that includes the winding L1 and the capacitive element C1 (C1'), and the other end of the circuit is grounded in an alternating current manner. Note that as configurations other than the capacitive element C1' of the semiconductor integrated circuit 3 shown in FIG. 14 are the same as those of the semiconductor integrated circuit 1 shown in FIG. 2, repeated explanations shall be omitted.

Figure 15:
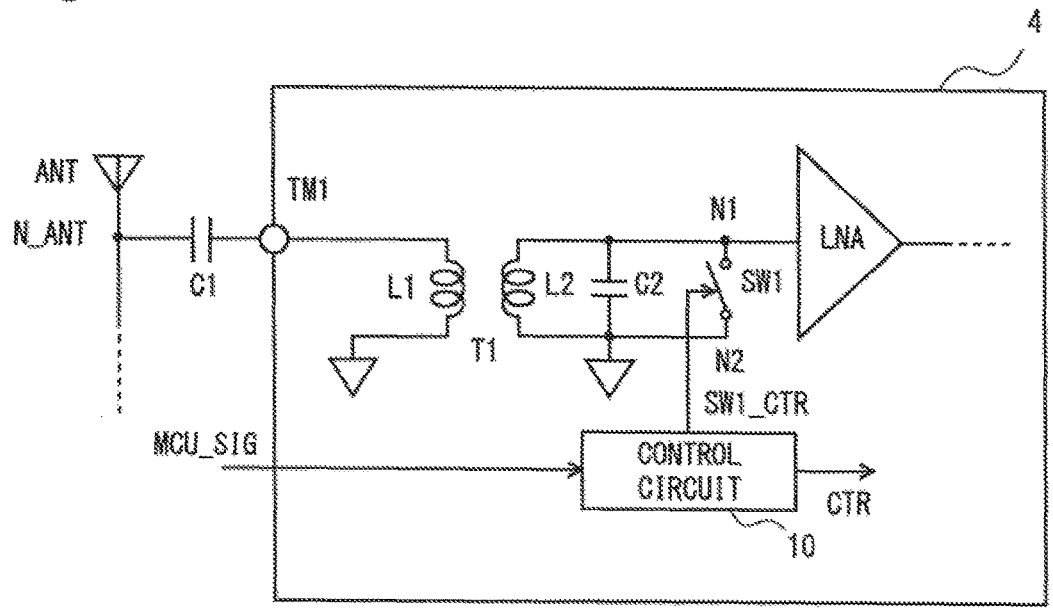
FIG. 15 is a circuit diagram showing another mounting example of the semiconductor integrated circuit according to the first embodiment.

[Another Configuration Example of Semiconductor Integrated Circuit: FIG. 15]

Further, the semiconductor integrated circuit 1 shown in FIG. 2 has a configuration in which the one end of the winding L2 of the transformer T1 (the node N1) and the other end of the winding L2 of the transformer T1 (the node N2) are connected respectively to the input terminals of the low-noise amplifier circuit LNA, i.e., a configuration in which a differential signal is supplied to the low-noise amplifier circuit LNA. However, in this embodiment, in a manner similar to a semiconductor integrated circuit 4 shown in FIG. 15, only one end of the winding L2 of the transformer T1 is connected to the input terminal of the low-noise amplifier LNA, and the other end of the winding L2 (the node N2) may be grounded in an alternating current manner. That is, an input of the low-noise amplifier circuit LNA may be a single-phase input. Note that as other configurations of the semiconductor integrated circuit 4 shown in FIG. 15 are the same as those of the semiconductor integrated circuit 1 shown in FIG. 2, repeated explanations shall be omitted.

Second Embodiment

Figure 20:
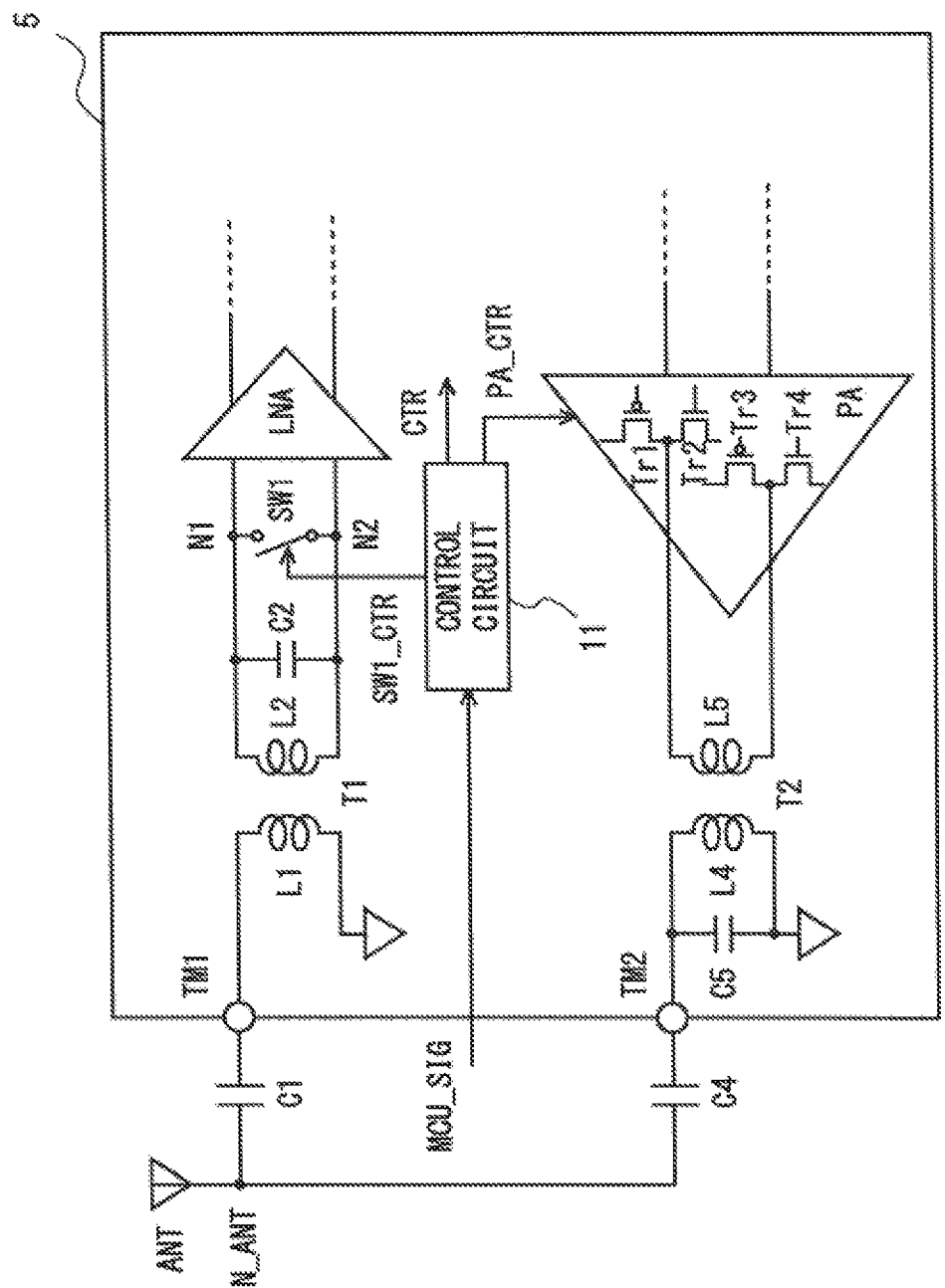
FIG. 20 is a circuit diagram showing an example of a semiconductor integrated circuit according to a second embodiment.

Next, a second embodiment shall be explained as follows. FIG. 20 is a circuit diagram showing an example of a semiconductor integrated circuit 5 according to the second embodiment. The semiconductor integrated circuit 5 shown in FIG. 20 shows a specific configuration example of the transmission passive circuit 12 and the transmission amplifier circuit PA that are included in the semiconductor integrated circuit 2 shown in FIG. 6 is shown. As other components are the same as those in the semiconductor integrated circuit explained in the first embodiment, repeated explanations shall be omitted.

[Configuration of Semiconductor Integrated Circuit: FIG. 20]

As shown in FIG. 20, the semiconductor integrated circuit 5 includes the transformer T1 including the windings L1 and L2, the capacitive element C2, the switch SW1, the low-noise amplifier circuit LNA, a transformer T2 including windings L4 and L5, a capacitive element C5, the transmission amplifier PA, and a control circuit 11. Note that as circuit elements of a reception system, which are the transformer T1, the capacitive element C2, the switch SW1, and the low-noise amplifier circuit LNA are the same as those explained in the first embodiment, repeated explanations shall be omitted.

As shown in FIG. 20, one and the other ends of the winding L5 of the transformer T2 are connected respectively to output terminals of the transmission amplifier circuit PA. That is, a transmission signal is supplied from the transmission amplifier circuit PA to one and the other ends of the winding L5 of the transformer T2. One end of the winding L4 of the transformer T2 is connected to the output terminal TM2, and the other end of the winding L4 of the transformer T2 is grounded (grounded in an alternating current manner). The capacitive element C5 is connected between the one end and the other end of the winding L4 of the transformer T2. Note that the capacitive element C5 may be omitted depending on a value of an output impedance of the transmission amplifier circuit PA.

The capacitive element C1 is connected between the input terminal TM1 of the semiconductor integrated circuit 5 and the antenna ANT. Further, a capacitive element C4 is connected between the output terminal TM2 of the semiconductor integrated circuit 5 and the antenna ANT.

The transmission amplifier circuit PA is, for example, a CMOS-type differential power amplifier circuit and includes PMOS transistors Tr1 and Tr3 and NMOS transistors Tr2 and Tr4. The drain of the PMOS transistor Tr1 and the drain of the NMOS transistor Tr2 are connected to the one end of the winding L5 of the transformer T2, and the drain of the PMOS transistor Tr3 and the drain of the NMOS transistor Tr4 are connected to the other end of the winding L5 of the transformer T2. A control signal PA_CTR (a driving voltage) is supplied from the control circuit 11 to each gate of the transistors Tr1 to Tr4.

[Operation of Semiconductor Integrated Circuit]

Next, an operation of the semiconductor integrated circuit 5 shall be explained as follows.

When the semiconductor integrated circuit 5 performs a transmission operation, the control circuit 11 controls the switch SW1 to be in the closed state (see the first embodiment). Further, the transmission amplifier circuit PA supplies a transmission signal to the winding L5 of the transformer T2. An operation mode of the transmission amplifier circuit PA at this time shall be referred to as a transmission mode.

More specifically, the control circuit 11 supplies the control signal PA_CTR to the transistors Tr1 to Tr4 of the transmission amplifier circuit PA and controls the transmission amplifier circuit PA to output the transmission signal (a differential signal). At this time, the transformer T2 functions as an impedance matching circuit for the transmission amplifier circuit PA. In the semiconductor integrated circuit 5 shown in FIG. 20, the capacitive elements C4 and C5 in addition to the transformer T2 constitute the impedance matching circuit for the transmission amplifier circuit PA.

On the other hand, when the semiconductor integrated circuit 5 performs a reception operation, the control circuit 11 controls the switch SW1 to be in the opened state (see the first embodiment). Further, the transmission amplifier circuit PA short-circuits both ends of the winding L5 of the transformer T2. An operation mode of the transmission amplifier circuit PA at this time shall be referred to as a short-circuit mode.

More specifically, the control circuit 11 controls the NMOS transistors Tr2 and Tr4 included in the transmission amplifier circuit PA to be in the ON state and the PMOS transistors Tr1 and Tr3 included in the transmission amplifier circuit PA to be in the OFF state. Thus, both of the ends of the winding L5 of the transformer T2 are connected to a ground potential. Accordingly, both of the ends of the winding L5 of the transformer T2 are short-circuited. Alternatively, the control circuit 11 controls the NMOS transistors Tr2 and Tr4 included in the transmission amplifier circuit PA to be in the OFF state and the PMOS transistors Tr1 and Tr3 included in the transmission amplifier circuit PA to be in the ON state. Thus, both of the ends of the winding L5 of the transformer T2 are connected to a power supply potential. Accordingly, both of the ends of the winding L5 of the transformer T2 are short-circuited. As described above, when both of the ends of the winding L5 of the transformer T2 are short-circuited, the impedance when the capacitance C4 side is viewed from the antenna ANT side can be made equivalent to an impedance of a sufficiently small capacitive element.

As shown in FIG. 20, the number of elements in the matching circuit of the transmission side is the same as the number of elements in the matching circuit of the reception side. Therefore, the degree of freedom for the design of the matching circuit of the transmission side is the same as that of the matching circuit of the reception side, and it is possible to design the transmission circuit in a manner similar to the design of the reception circuit explained in the first embodiment. Accordingly, by appropriately selecting circuit constants of the transformer T2 and capacitive elements C4 and C5, the output impedance from the transmission circuit PA can be matched when the semiconductor integrated circuit 5 performs the transmission operation. At the time of the reception operation, when both of the ends of the winding L5 of the transformer T2 are short-circuited, the impedance when the capacitance element C4 side is viewed from the antenna ANT side can be made equivalent to the impedance of the sufficiently small capacitive element. Therefore, an influence of the transmission passive circuit including the transformer T2 on the reception circuit can be ignored or an equivalent capacitance when the semiconductor integrated circuit 5 side is viewed from the antenna ANT side (a sufficiently small capacitance) can function by including the equivalent capacitance in one of the components of the impedance matching circuit of the reception circuit.

Third Embodiment

Figure 21:
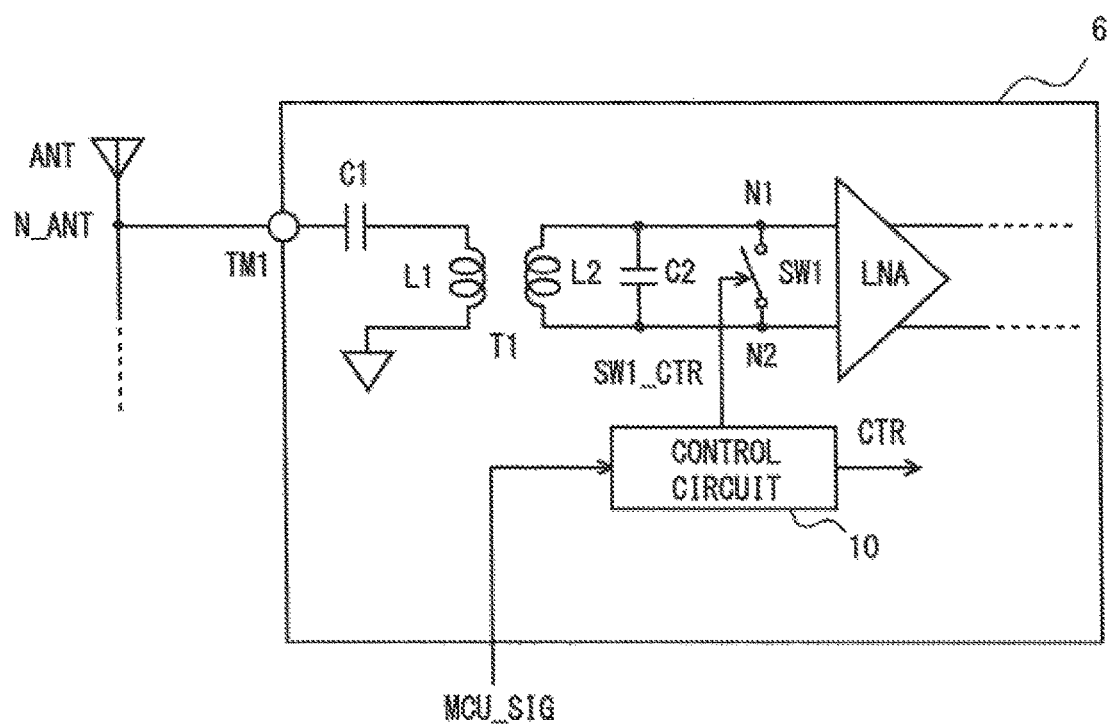
FIG. 21 is a circuit diagram showing an example of a semiconductor integrated circuit according to a third embodiment.

[Configuration of Semiconductor Integrated Circuit: FIG. 21]

Next, a third embodiment shall be explained as follows. FIG. 21 is a circuit diagram showing an example of a semiconductor integrated circuit 6 according to the third embodiment. A difference between the semiconductor integrated circuit 6 shown in FIG. 21 and the semiconductor integrated circuit 1 shown in FIG. 2 is that in the semiconductor integrated circuit 6 (a semiconductor chip), the capacitive element C1 is formed inside the semiconductor integrated circuit 6. As other configurations are the same as those of the semiconductor integrated circuit that has been explained in the first embodiment, repeated explanations shall be omitted.

As shown in FIG. 21, the capacitive element C1 is formed inside the semiconductor integrated circuit 6 (the semiconductor chip). The capacitive element C1 is configured to include a surge resistance. The capacitive element C1 can be configured using, for example, a capacitance between adjacent wirings. As described above, when the capacitive element C1 is provided inside the semiconductor integrated circuit 6 (the semiconductor chip) and integrated, it is possible to further miniaturize the semiconductor integrated circuit used in a radio communication apparatus and reduce the cost.

Figure 22:
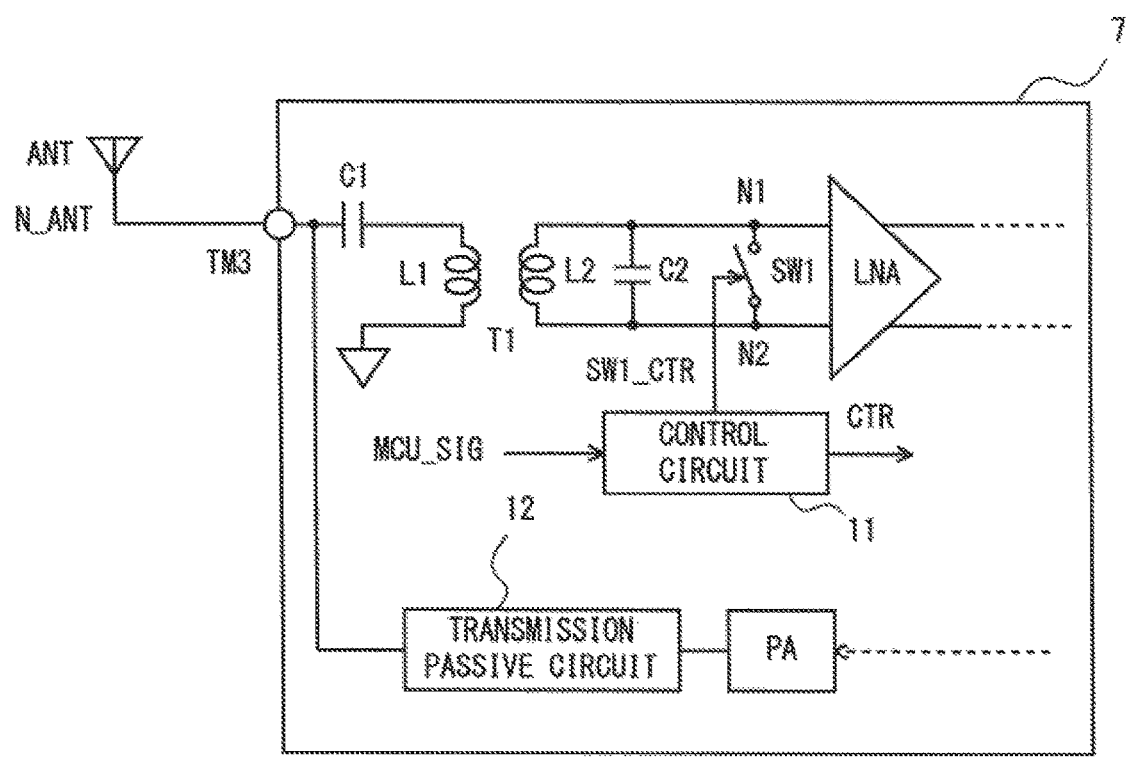
FIG. 22 is a circuit diagram showing another configuration example of the semiconductor integrated circuit according to the third embodiment.

[Configuration of Semiconductor Integrated Circuit: FIG. 22]

Moreover, in this embodiment, as shown in a semiconductor integrated circuit 7 shown in FIG. 22, the winding L1 of the transformer T1 (i.e., an input side of the reception system circuit) and an output side of the transmission passive circuit 12 (i.e., an output side of the transmission system circuit) may be connected to each other inside the semiconductor integrated circuit 7 (the semiconductor chip). In this case, the input side of the reception system circuit and the output side of the transmission system circuit are connected to an input/output terminal TM3 of the semiconductor integrated circuit 7. With such a configuration, wiring from the semiconductor integrated circuit 7 to the antenna ANT can be one line, and thus a mounting area of a mounting substrate when the semiconductor integrated circuit 7 is mounted on the mounting substrate can be reduced.

Other Embodiment

Next, other embodiment shall be explained as follows.

In this embodiment, the above-explained switch SW1 that is used in the semiconductor integrated circuit may be configured in a manner described below.

Figure 23:
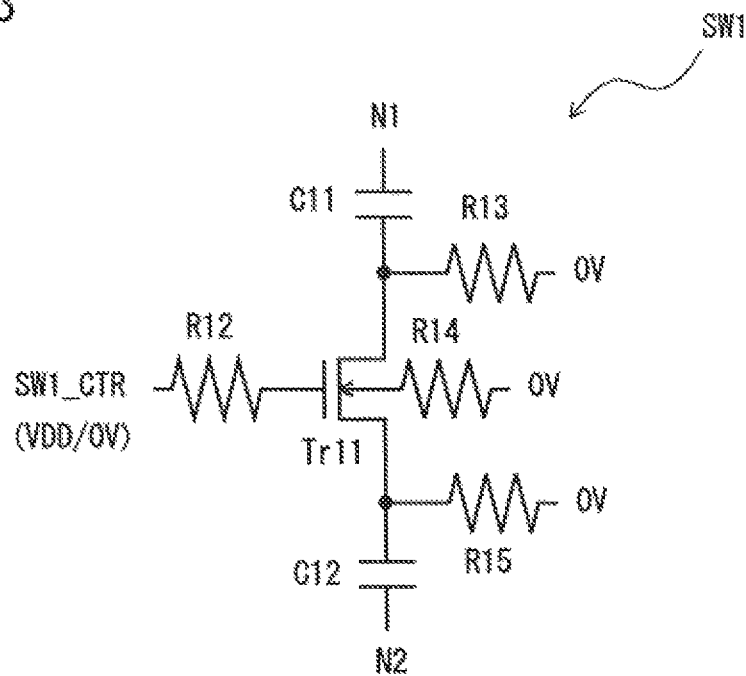
FIG. 23 is a circuit diagram showing another configuration example of a switch used in a semiconductor integrated circuit.

[Configuration Example of Switch SW1: FIG. 23]

FIG. 23 is a circuit diagram showing a configuration example of the switch SW1. The switch SW1 can be comprised of, for example, an N-type MOSFET (Tr11), resistors R12 to R15, and capacitive elements C11 and C12. The capacitive elements C11 and C12 are provided respectively to the drain and source of the MOSFET (Tr11). In other words, the drain and source of the MOSFET (Tr11) are connected to one end (the node N1) and the other end (a node N2) of the winding L2 of the transformer T1 via the capacitive elements C11 and C12, respectively. Further, 0 V DC bias is applied to the drain and source of the MOSFET (Tr11) via the resistors R13 and R15, respectively. Furthermore, 0 V DC bias is applied to a body of the MOSFET (Tr11) via the resistor R14. The control signal SW1_CTR (the voltage VDD or 0 V) is applied to the gate of the MOSFET (Tr11) via the resistor R12.

With the switch SW1 having such a configuration, a DC bias potential of the winding L2 of the secondary side of the transformer T1 into which the switch SW1 is inserted can be freely set. Note that a P-type MOSFET may be used in place of the N-type MOSFET (Tr11) in the switch SW1 shown in FIG. 23.

Figure 24:
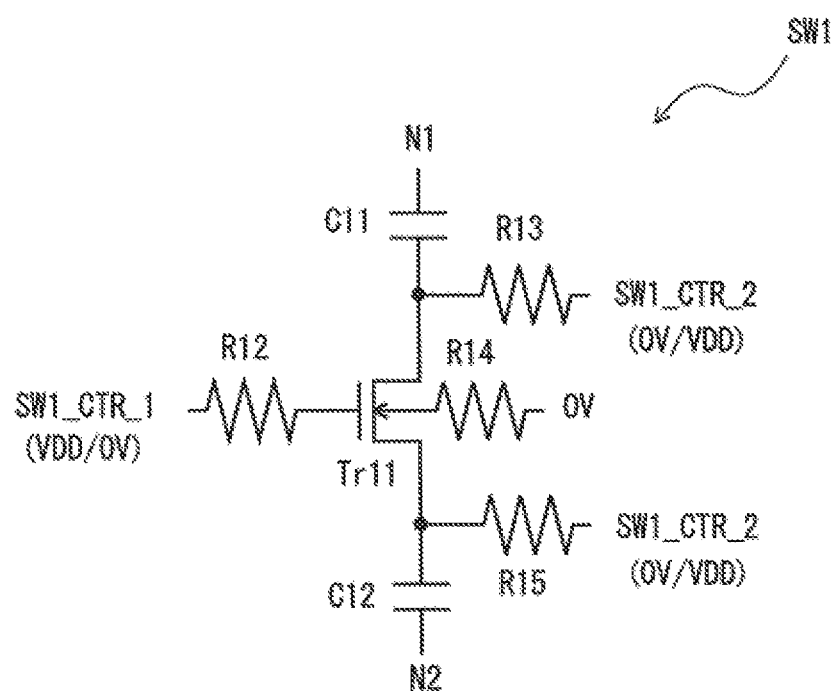
FIG. 24 is a circuit diagram showing another configuration example of the switch used in the semiconductor integrated circuit.

[Configuration Example of Switch SW1: FIG. 24]

FIG. 24 is a circuit diagram showing a configuration example of the switch SW1. The switch SW1 shown in FIG. 24 has the same configuration as that of the switch SW1 shown in FIG. 23. However, in the switch SW1 shown in FIG. 24, a DC bias supplied to the drain and source of the N-type MOSFET (Tr11) is a voltage of a phase opposite to a phase of the voltage supplied to the gate (0 V or the voltage VDD). More specifically, when 0 V is applied to the gate of the MOSFET (Tr11), the VDD is applied to the drain and source of the MOSFET (Tr11). On the other hand, when the voltage VDD is applied to the gate of the MOSFET (Tr11), 0 V is applied to the drain and source of the MOSFET (Tr11). In other words, a control signal SW1_CTR_1 is applied to the gate of the MOSFET (Tr11), and a control signal SW1_CTR_2 having a phase opposite to a phase of the control signal SW1_CTR_1 is applied to the drain and source of the MOSFET (Tr11).

With such a configuration, a gate-source voltage when the MOSFET (Tr11) is in the OFF state can be −VDD. Therefore, even when a reception signal having a large voltage amplitude is supplied to the semiconductor integrated circuit, the switch SW1 can be maintained in the OFF state.

Figure 25:
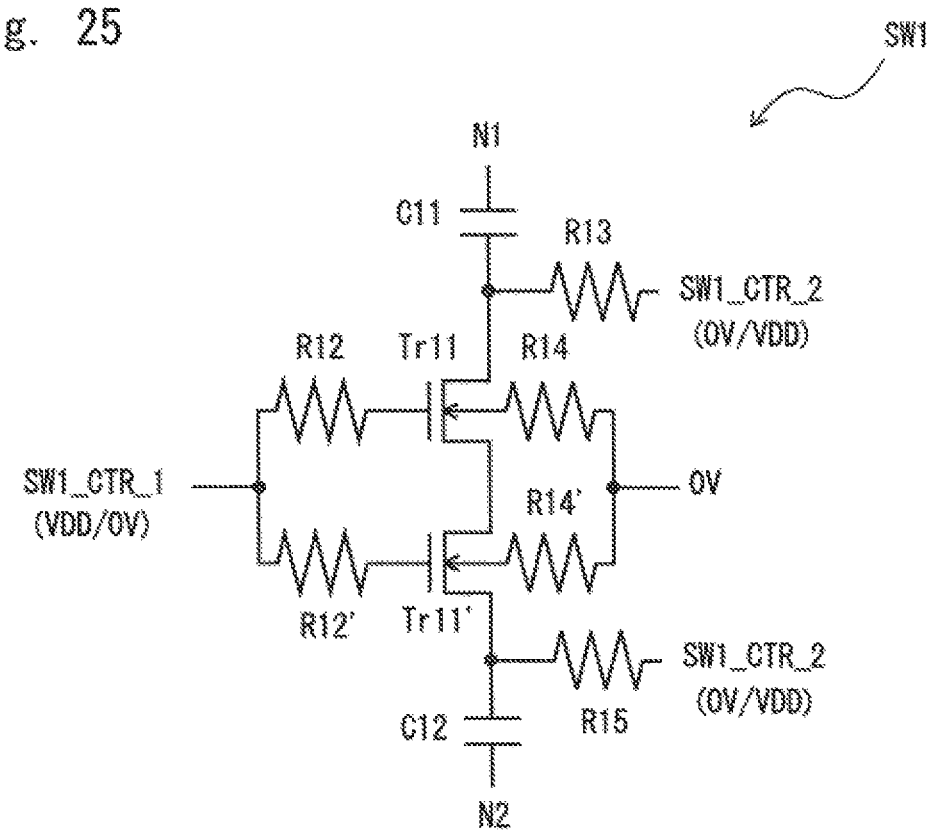
FIG. 25 is a circuit diagram showing another configuration example of the switch used in the semiconductor integrated circuit.

[Configuration Example of Switch SW1: FIG. 25]

In this embodiment, two stages of MOSFETs (Tr11) in the switch SW1 shown in FIG. 24 may be connected in series. More specifically, as shown in FIG. 25, an N-type MOSFET (Tr11') may be connected in series to the N-type MOSFET (Tr11). At this time, 0 V DC bias is applied to a body of the added MOSFET (Tr11') via a resistor R14'. Further, the control signal SW1_CTR_1 (the voltage VDD or 0 V) is applied to the gate of the added MOSFET (Tr11') via a resistor R12'. Other configurations are the same as those of the switch SW1 shown in FIG. 24. Note that the number of MOSFETs connected in series may be three or more.

By connecting a plurality of MOSFETs in series in the manner described above, even when a reception signal having a large voltage amplitude is supplied from a semiconductor integrated circuit, the switch SW1 can be maintained in the OFF state.

Note that although a case in which the semiconductor integrated circuit according to this embodiment is applied to a smart meter has been explained above, the semiconductor integrated circuit according to this embodiment can be applied to an apparatus including a communication circuit other than a smart meter.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor integrated circuit comprising:
   a first transformer that includes a first winding and a second winding;
   a low-noise amplifier circuit that includes an input terminal and amplifies a radio signal, at least one end of the second winding of the first transformer being connected to the input terminal; and
   a switch that is provided between the one end and another end of the second winding of the first transformer, wherein
   the semiconductor integrated circuit causes the switch to be in an opened state and the first transformer to function as an input impedance matching circuit for the low-noise amplifier circuit in a first period in which a reception signal is supplied to the first winding of the first transformer via a predetermined node, and
   the semiconductor integrated circuit causes the switch to be in a closed state in a second period in which another circuit connected to the predetermined node operates,
   wherein the another circuit includes a transmission amplifier and a second transformer, different from the first transformer, the second transformer including a first and a second winding, and
   wherein one end of the second winding of the second transformer is electrically connected to the predetermined node, and another end of the second winding of the second transformer is grounded in an alternating current manner, and
   wherein at least one end of the first winding of the second transformer is connected to an output terminal of the transmission amplifier.

2. The semiconductor integrated circuit according to claim 1, further comprising:
   a first capacitive element between the one end and the other end of the second winding of the first transformer, the first capacitive element being provided in parallel to the switch.

3. The semiconductor integrated circuit according to claim 1, further comprising:
   a second capacitive element that is connected in series to the first winding of the first transformer,
   wherein the reception signal is supplied to one end of a circuit including the first winding of the first transformer and the second capacitive element, and another end of the circuit is grounded in an alternating current manner.

4. The semiconductor integrated circuit according to claim 1, wherein
   the one end and the other end of the second winding of the first transformer are connected to the input terminal of the low-noise amplifier circuit.

5. The semiconductor integrated circuit according to claim 1, wherein
   at least the first transformer, the low-noise amplifier, and the switch are integrated into one semiconductor chip.

6. The semiconductor integrated circuit according to claim 1,
   wherein
   the another circuit is a transmission circuit,
   the first period is a period in which the semiconductor integrated circuit performs a reception operation, and the second period is a period in which the semiconductor integrated circuit performs a transmission operation.

7. The semiconductor integrated circuit according to claim 6,
   wherein the transmission circuit comprises:
   the second transformer; and
   a transmission amplifier circuit that includes an output terminal,
   wherein at least one end of the first winding of the second transformer is connected to the output terminal of the transmission amplifier, and
   wherein the second transformer functions as an impedance matching circuit for the transmission amplifier circuit in the second period.

8. The semiconductor integrated circuit according to claim 7, wherein
   the transmission amplifier circuit includes a transmission mode for supplying a transmission signal to the first winding of the second transformer and a short-circuit mode for short-circuiting both the one end and another end of the first winding of the second transformer,
   the transmission amplifier circuit operates in the short-circuit mode in the first period, and
   the transmission amplifier circuit operates in the transmission mode in the second period.

9. The semiconductor integrated circuit according to claim 7, further comprising:
   a third capacitive element that is connected between an input terminal and the predetermined node, the input terminal being connected to the first winding of the first transformer; and
   a fourth capacitive element that is connected between an output terminal and the predetermined node, the output terminal being connected to the second winding of the second transformer.

10. The semiconductor integrated circuit according to claim 3, wherein
    at least the first transformer, the low-noise amplifier circuit, the switch, and the second capacitive element are integrated into one semiconductor chip.

11. The semiconductor integrated circuit according to claim 6, wherein
    at least the first transformer, the low-noise amplifier circuit, the switch, and the transmission circuit are integrated into one semiconductor chip, and
    the first winding of the first transformer and an output side of the transmission circuit are connected to an input/output terminal included in the semiconductor chip inside the semiconductor chip.

12. A communication module into which at least the first transformer, the second transformer, the low-noise amplifier, the switch, the transmission amplifier, the third capacitive element, and the fourth capacitive element included in the semiconductor integrated circuit according to claim 9 are integrated.

13. A smart meter including the communication module according to claim 12.

14. A communication module comprising:
    a semiconductor chip comprising:
    a first transformer that includes a first winding and a second winding;
    a low-noise amplifier circuit that includes an input terminal and amplifies a radio signal, at least one end of the second winding of the first transformer being connected to the input terminal of the low-noise amplifier circuit;

a switch that is provided between the one end and another end of the second winding of the first transformer;

an input terminal that is connected to one end of the first winding of the first transformer; and an output terminal that is connected to a transmission circuit, the transmission circuit including a second transformer, different from the first transformer, the second transformer including a first and a second winding, wherein one end of the second winding of the second transformer is electrically connected to the output terminal, and another end of the second winding of the second transformer is grounded in an alternating current manner, and at least one end of the first winding of the second transformer is connected to an output terminal of a transmission amplifier, wherein the first transformer, the low-noise amplifier circuit, the switch, the input terminal, and the output terminal are integrated into the semiconductor chip; and a mounting substrate, the semiconductor chip being mounted on the mounting substrate, wherein the switch is opened and the first transformer functions as an input impedance matching circuit for the low-noise amplifier circuit in a period when the semiconductor chip performs a reception operation, and the switch is closed in a period when the semiconductor chip performs a transmission operation.

* * * * *